(12) United States Patent
Rohde et al.

(10) Patent No.: US 7,088,189 B2
(45) Date of Patent: Aug. 8, 2006

(54) INTEGRATED LOW NOISE MICROWAVE WIDEBAND PUSH-PUSH VCO

(75) Inventors: Ulrich L. Rohde, Upper Saddle River, NJ (US); Reimund Rebel, Ringwood, NJ (US); Ajay Kumar Poddar, Fairlawn, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 0 days.

(21) Appl. No.: 11/007,879

(22) Filed: Dec. 9, 2004

(65) Prior Publication Data
US 2005/0156675 A1    Jul. 21, 2005

Related U.S. Application Data

(63) Continuation-in-part of application No. 10/937,525, filed on Sep. 9, 2004.

(60) Provisional application No. 60/501,371, filed on Sep. 9, 2003, provisional application No. 60/501,790, filed on Sep. 10, 2003, provisional application No. 60/527,957, filed on Dec. 9, 2003, provisional application No. 60/528,670, filed on Dec. 11, 2003, provisional application No. 60/563,481, filed on Apr. 19, 2004, provisional application No. 60/527,957, filed on Dec. 9, 2003, provisional application No. 60/563,481, filed on Apr. 19, 2004.

(51) Int. Cl.
*H03B 5/18* (2006.01)
(52) U.S. Cl. ..................... 331/56; 331/107 P
(58) Field of Classification Search .................. 331/56, 331/36 C, 107 P
See application file for complete search history.

(56) References Cited

U.S. PATENT DOCUMENTS

| | | | |
|---|---|---|---|
| 2,502,488 A | 4/1950 | Shockley | |
| 2,524,035 A | 10/1950 | Bardeen et al. | |
| 3,373,379 A | 3/1968 | Black | |
| 4,435,688 A | 3/1984 | Shinkawa et al. | |
| 4,527,130 A | 7/1985 | Lutteke | |
| 4,619,001 A | 10/1986 | Kane | |
| 4,621,241 A | 11/1986 | Kiser | |
| 4,692,714 A * | 9/1987 | Galani | 331/1 R |
| 4,812,784 A | 3/1989 | Chung et al. | |
| 4,868,526 A | 9/1989 | Camiade | |
| 5,041,799 A | 8/1991 | Pirez | |

(Continued)

FOREIGN PATENT DOCUMENTS

EP    0 475 262 A    3/1992

(Continued)

OTHER PUBLICATIONS

A. K. Poddar, S.K. Koul, and B. Bhat, "Millimeter Wave Evanescent Mode Gunn Diode Oscillator in Suspended Stripline Configuration." 22nd international Conference on Millimeter Waves, pp. 265-266, Jul. 1997.

(Continued)

*Primary Examiner*—Joseph Chang
(74) *Attorney, Agent, or Firm*—Lerner, David, Littenberg, Krumholz & Mentlik, LLP

(57) ABSTRACT

In one aspect, a voltage controlled oscillator is provided that includes circuitry comprising tunable coupled resonator networks, which are coupled to a terminal of a pair of three-terminal devices through a tuning voltage network which supports wide-band tunability. In another aspect, a wide-band tunable resonator is provided that is amenable to integration in the integrated circuit form.

25 Claims, 17 Drawing Sheets

U.S. PATENT DOCUMENTS

| | | | |
|---|---|---|---|
| 5,231,361 | A | 7/1993 | Smith et al. |
| 5,373,264 | A | 12/1994 | Higgins |
| 5,402,087 | A | 3/1995 | Gorczak |
| 5,650,754 | A | 7/1997 | Joshi |
| 5,661,439 | A | 8/1997 | Watkins et al. |
| 5,748,051 | A | 5/1998 | Lewis |
| 5,854,578 | A | 12/1998 | Minasi et al. |
| 6,124,767 | A | 9/2000 | Woods |
| 6,297,708 | B1 | 10/2001 | Lemay |
| 6,489,853 | B1 | 12/2002 | Lewis |
| 6,624,726 | B1 | 9/2003 | Niu |
| 6,630,869 | B1 | 10/2003 | Flynn et al. |
| 6,714,088 | B1 | 3/2004 | Chang |
| 6,714,772 | B1 | 3/2004 | Kasahara et al. |
| 6,731,181 | B1 | 5/2004 | Fukayama et al. |
| 6,734,745 | B1 | 5/2004 | Sakai |
| 6,737,928 | B1 | 5/2004 | Kubo et al. |
| 2001/0004225 | A1* | 6/2001 | Nicholls et al. .............. 331/34 |
| 2002/0084860 | A1 | 7/2002 | Festag et al. |
| 2003/0160660 | A1 | 8/2003 | Chang et al. |
| 2004/0095197 | A1 | 5/2004 | Wang et al. |
| 2004/0130402 | A1 | 7/2004 | Marquardt |
| 2005/0156683 | A1 | 7/2005 | Rohde et al. |

FOREIGN PATENT DOCUMENTS

| | | |
|---|---|---|
| EP | 0 800 224 A | 10/1997 |
| EP | 0 843 374 A | 5/1998 |
| EP | 1 093 216 A | 4/2001 |
| JP | 59-072205 A | 4/1984 |
| JP | 59-139708 A | 8/1984 |
| WO | WO-02/17476 A | 2/2002 |
| WO | WO-02/05416 A1 | 11/2002 |

OTHER PUBLICATIONS

D. Ham, A. Hajimiri, "Concepts and Methods in Optimization of Integrated LCVCOs," IEEE Journal of Solid-state Circuits, Jun. 2001.

Douglas R. Jachowski, "Passive Enhancement of Resonator Q in Microwave Notch Filters", IEEE MTT-S Digest, pp. 1315-1318, Jun. 2004.

E. Hegazi, H. Sjoland, and A. Abidi, "A Filtering Technique to Lower LC Oscillator Phase Noise," IEEE J. Solid-State Circuits, vol. 36, pp. 1921-1929, Dec. 2001.

Franz X. Sinnesbichler, "Hybrid Millimeter-Wave Push-Push Oscillators using Silicon-Germanium HBTs," IEEE MTT-S, vol. 51, Feb. 2003.

H.C. Chang,"Phase noise self-injection-locked oscillators-Theory and axperiment," IEEE Transactions on Microwave Theory and Techniques, vol. 51, No. 9 , pp. 1994-1999, Sep. 2003.

Henkes, Dale D, 'Designing Short High Q Resonators', Design, Dec. 2003, pp. 75-109.

J. C. Nallatamby, M. Prigent, M. Camiade, J. Obregon, "Phase Noise in Oscillators- Leeson Formula Revisited," IEEE Transactions on Microwave Theory and Techniques, vol. 51, No. 4, 1386-1394, Apr. 2003.

M. Odyniec, Editor, RF and Microwave Oscillator Design, Chapter 3: Linearity, Time Variation, and Oscillator Phase Noise, by T. Lee and A. Hajimiri, Artech House, 2002.

M. Vidmar, "A Wideband, Varactor-Tuned Microstrip VCO," Microwave Journal, Jun. 1999.

U.L. Rohde, "A Novel RFIC for UHF Oscillators (Invited)," 2000 IEEE Radio Frequency Integrated Circuits (RFIC) Symposium, Boston, MA, Jun. 11-13, 2000.

U.L. Rohde, D.P. Newkirk, RF/Microwave Circuit Design for Wireless Applications, pp. (123-197; Chapter 5), John Wiley & Sons, Apr. 2000, ISBN 0-471-29818-2.

A. K. Poddar and K. N. Pandey, "Microwave switch using MEMS technology,"8th IEEE International Symposium, EDMO-2000, pp. 134-139, Nov. 2000, UK.

A. M. Elsayed and M. I. Elmasry," Low-Phase-Noise LC Quadrature VCO using Coupled Tank Resonators in Ring," IEEE, JSSC, vol. 36, pp. 701-705, Apr. 2001.

A. Ward and B. Ward, "A Comparison of various Bipolar Transistor Biasing Circuits," Applied Microwave & Wireless, vol. 13, pp. 30-52, 2001.

A.V. Grebennikov, "Microwave Transistor Oscillators: an Analytic Approach to Simplify Computer-Aided Design", Microwave Journal, pp. 294-299, May 1999.

Amir Mortazawi, Heinrich D. Foltz, and Tatsuo Itoh, "A Periodic Second Harmonic Spatial Power Combining Oscillator", IEEE, MTT, vol. 40, pp. 851-856, May 1992.

Andrea Borgioli, Pochi Yeh, and Robert A. York, "Analysis of Oscillators with External Feedback Loop for Improved Locking Range and Noise Reduction," IEEE Trans. MTT, vol. 47, pp. 1535-1543, Aug. 1999.

Andrew V. Grebennikov, "Microwave FET Oscillators: an Analytic Approach to Simplify Computer-Aided Design", Microwave journal, pp. 102-111, Jan. 2000.

B. Van der Pol, "The Nonlinear Theory of Electrical Oscillators,"Proc. IRE, vol. 22 No. 9, pp. 1051-1086, Sep. 1934.

Byeong-Ha Park, "A Low-Voltage, Low Power, CMOS 900 MHz Frequency Synthesizer," Ph.D. Dissertation, Georgia Institute of Technology, Dec. 1997.

C. Arnaud, D. Basataud, J. Nebus, J. Teyssier, J. Villotte, D. Floriot, "An Active Pulsed RF and Pulsed DC Load-Pull System for the Characterization of HBT Power Amplifiers Used in Coherent Radar and Communication Systems," IEEE Transactions on Mfl, vol. 48, No. 12, pp. 2625-2629, Dec. 2000.

D. B. Leeson, A Simple Model of Feedback Oscillator Noise Spectrum, Proc. IEEE, pp. 329-332, 1966.

F. X. Sinnesbichier, B Hauntz and 0. R. Olbrich, "A Si/SiGe HBT Dielectric Resonator Push-Push Oscillators at 58 GHz," IEEE Microwave Guided Wave Lett. vol. 10, pp. 145-147, Apr. 2000.

F. X. Sinnesbichler and 0. R. Olbrich, "SiGe HBT Push-Push Oscillators for V-Band Operation," IEEE MTT-S silicon Monolithic Integrated Circuits in RF Systems Symp., Garmish, Germany, Apr. 26-28, 2000, pp. 55-59.

F. X. Sinnesbichler, B. Hautz, G. R. Olbrich,"A Low Phase Noise 58 GHz SiGe HBT Push-Push, Oscillator with Simultaneous 29 GHz Output", IEEE, MTT-S Digest, pp. 35-38, 2000.

F. X. Sinnesbichler, H. Geltinger, and G. R. Olbrich, "A 38 0Hz Push-Push Oscillator Based on 25 GHZ-fT BJTs," IEEE Microwave Guided Wave Lett. vol. 9 pp. 151-153, Apr. 1999.

F.M. Ghannouchi, R. Larose, R.G. Bosisio, "A New Multiharmonic Loading Method for Large-Signal Microwave and Millimeter-Wave Transistor Characterization," IEEE Transactions on MTT, vol. 39, No. 6, pp. 986-992, Jun. 1991.

Franco Ramirez, Jose Lius Garcia H., Tomas Fernandez and Almudena Suarez, "Nonlinear Simulation Techniques for the Optimized Design of Push-Push Oscillators", IEEE, MTT-S Digest, pp. 2157-2160, 2003.

H. Abe, Y. Aono, 11 GHz GaAS Power MESFET Load-Pull Measurements Utilizing a New Method of Determining Tuner Y-Parameters, IEEE Transactions on Microwave Theory and Techniques, vol. 27, No. 5, pp. 394-399, May 1979.

H. Stark, and J. W. Woods, Probability, Random Processes, and Estimation Theory for Engineers. New York: Prentice-Hall, 1986.

Hai Xiao, Takayuki Tanka and Masayoshi Aikawa, "A Ka-Band Quadruple-Push Oscillator", IEEE, MTT-S Digest, pp. 889-892, 2003.

Heng-Chia Chang, "Analysis of Coupled Phase-Locked Loops With Independent Oscillators for Beam Control Active Phased," IEEE Trans. MTT, vol. 52, pp. 1059-1065, Mar. 2004.

Heng-Chia Chang, Xudong Cao, Mark j. Vaughan, Umesh K. Mishra, and R. York,"Phase Noise in Externally Injection-Locked Oscillator Arrays," IEEE Trans. MTT, vol. 45, pp. 2035-2042, Nov. 1997.

Heng-Chia Chang, Xudong Cao, Umesh K. Mishra, and R. York, "Phase Noise in Coupled Oscillators: Theory and experiment," IEEE Trans. MTT, vol. 45, pp. 604-615, May 1997.

J. Everard, Fundamentals of RE Circuit Design with Low Noise Oscillators, John Wiley & Sons. Ltd, 2001.

J. Heinbockel and A. Mortazawi,"A Periodic Spatial Power Combining MESFET Oscillator", IEEE, MTT-S Digest, pp. 545-548, 1992.

J. R. Bender, C. Wong, Push-Push Design Extends Bipolar Frequency Range, Microwave & RF, pp. 91-98, Oct. 1983.

Jeong-Geun Kim, Dong-Hyun Baek, Sang-Hoon Jeon, Jae-Woo Park and Songcheol Hong, A 60 GHz InGaP/GaAs HBT Push-Push MMIC VCO, IEEE, MTT-S Digest, pp. 885-888, 2003.

Jonathan J. Lynch and Robert A. York, "Synchronization of Oscillators Coupled through Narrow-Band Networks," IEEE Trans. MIT, pp. 238-249, Feb. 2001.

Jonathan J. Lynch and Robert A. York,"An Analysis of Mode-Locked Arrays of Automatic Level Control Oscillators," IEEE Trans. on Circuits and Systems-I, vol. 41, pp. 859-865, Dec. 1994.

Jwo-Shiun Sun, "Design Analysis of Microwave Varactor-Tuned Oscillators", Microwave journal, pp. 302-308, May 1999.

K. W. Kobayashi et al., "A 108-0Hz InP-based HBT Monolithic Push-Push VCO with Low Phase Noise and Wide Tuning Bandwidth," IEEE J. Solid-State Circuits, vol. 34, pp. 1225-1232, Sep. 1999.

K.O,"Estimation Methods for Quality Factors of Inductors Fabricated In Silicon Integrated Circuit Process Technologies,"IEEE, JSSS, pp. 1565-1567, Sep. 1997.

Kaneyuki Kurokawa, "Noise in Synchronized Oscillators," IEEE Trans. MTT, vol. 16, pp. 234-240, Apr. 1968.

Kaneyuki Kurokawa, "The Single Cavity Multiple Device Oscillator," IEEE Trans. MTT, vol. 19, pp. 793-801, Oct. 1971.

Klaus F. Schunemann and Karl Behm, "Nonlinear Noise Theory for Synchronized Oscillators," IEEE Trans. MTT, vol. 27, pp. 452-458, May 1979.

L. Dussopt, d. Guillois, and 0. Rebeiz, "A Low Phase Noise Silicon 9 0Hz VCO and an 18 0Hz Push-Push Oscillator,"IEEE MTT-S. Digest, 2002, pp. 695-698.

M. Kuramitsu and F. Takasi, "Analytical method for Multimode Oscillators Using the Averaged Potential,"Elec. Communication Japan, vol. 66-A, pp. 10-19, 1983.

M. Regis, 0. Llopis, and J. Graffeuil, "Nonlinear Modeling and Design of Bipolar Transistor ultra Low Phase-Noise Dielectric-Resonator Oscillators", IEEE transaction on MTT, vol. 46, No. 10, pp. 1589-1593, Oct. 1998.

M. Schott, H. Kuhnert, J. Hilsenbeck, J. Wurlf, and H. Heinrich, "38 GHz Push-Push GaAs-HBT MMIC Oscillator,"IEEE MTT-S, digest, 2002, pp. 839-842.

M. Ticbout,"Low power, Low Phase Noise, Differentially Tuned Quadrature VCO Design in Standard CMOS," IEEE-JSSS, vol. 36, pp. 10 18-1024, Jul. 2001.

Mortazawi A and B. C. De Loach, Jr., "Multiple Element Oscillators Utilizing a New Power Combining Technique," in IEEE MTT-S Tnt. Microwave Symp. Dig., 1992, pp. 1093-1096.

P. Berini, M. Desgagne, F.M. Ghannouchi, R.G. Bosisio, "An Experimental Study of the Effects of Harmonic Loading on Microwave MESFET Oscillators and Amplifiers," IEEE Transactions on MTT, vol. 42, No. 6, pp. 943-950, Jun. 1994.

Q. Cai, J. Gerber, S. Peng, "A Systematic Scheme for Power Amplifier Design Using a Multi-Harmonic Load-Pull Simulation Technique," 1998 IEEE MTT-S Symposium Digest, vol. 1, pp. 161-165, Jun. 7-12, 1998.

R. A. York and R.C. Compton,"Mode-Locked Oscillator Arrays", IEEE Microwave and Guided Letter, vol. 1, pp. 215-218, Aug. 1991.

R. A. York, "Nonlinear Analysis of Phase Relationship in Quasi-Optical Oscillator Arrays,"IEEE Trans. Microwave Theory Tech., vol. 41, pp. 1799-1809, Oct. 1993.

R. A. York, P. Liao, and J. J. Lynch, "Oscillator Array Dynamics with Broad-Band N-Port Coupling Networks," IEEE Trans. Microwave Theory Tech., vol. 42, pp. 2040-2045, Nov. 1994.

R. Adler, "A Study of Locking Phenomena in Oscillators, "Proc. IEEE, vol. 61, pp. 180-1385, Oct. 1973.

R. G. Freitag, S.H. Lee, D.M. Krafcsik, D.E. Dawson and J. E. Degenford,"Stability and Improved Circuit Modeling Considerations for High Power MMIC Amplifiers", IEEE, MM-Wave Monolithic Circuits Symposium, pp. 2169-2172, 2003.

R. J. Hawkins, "Limitations of Nielsen's and Related Noise Equations Applied to Microwave Bipolar Transistors and a New Expression for the Frequency and Current Dependent Noise Figure," Solid-State Electron., vol. 20 pp. 191-196, 1977.

Reider L. Kuvas, "Noise in Single Frequency Oscillators and Amplifiers," IEEE Trans. Microwave Theory Tech., vol. MTT-21, pp. 127-134, Mar. 1973.

Ronald G. Freitag, "A Unified Analysis of MMIC Power Amplifier Stability,"IEEE, MTT-S Digest, pp. 297-300, 1992.

S. Kudszus, W. H. Haydi, A. Tessmann, W. Bronner, and M. Schlechtweg, "PushPush Oscillators for 94 and 140 0Hz Applications Using Standard Pseudomorphic GaAs HEMTs,"IEEE MTT-S, Microwave Symp. Digest, 2001, pp. 1571-1574.

Shigeji Nogi, Jenshan Lin and Tatsuo Itoh., Mode Analysis and Stabilization of a Spatial Power Combining Array with Strongly Coupled oscillators, IEEE, MTT, vol. 41, pp. 1827-1837, Oct. 1993.

Shih-Chieh Yen and Tah-Hsiung Chu,"An Nth-Harmonic Oscillator Using an N-Push Coupled Oscillator Array with Voltage-Clamping Circuits", IEEE, MTT-S Digest, pp. 545-548, 1992.

T. H. Hsu and C.P. Snapp, "Low-Noise Microwave Bipolar Transistor with Sub-Half-Micrometer Emitter Width," IEEE Trans. Electron Devices, vol. ED-25, pp. 723-730, Jun. 1978.

U. L. Rohde, "A New and Efficient Method of Designing Low Noise Oscillators," Ph.D. Dissertation, Technical University of Berlin, Feb. 12, 2004.

U. L. Rohde, A. K. Poddar, Juergen Schoepf, Reimund Rebel, and Parimal Patel, "Low Noise Low Cost Wideband N-Push VCO," IEEE, IMS Symposium, MTT2005, USA.

U. L. Rohde, K. Juergen Schoepf, A.K. Poddar, "Low Noise VCOs Conquer Wideband," Microwaves & RF, pp. 98-106, Jun. 2004.

U.L. Rohde, "Improved Noise Modeling of GaAs FETS: Using an Enhanced Equivalent Circuit Technique," Microwave Journal, pp. 87-101—Nov. 1991.

U.L. Rohde, "Parameter Extraction for Large Signal Noise Models and Simulation of Noise in Large Signal Circuits Like Mixers and Oscillators," 23rd European Microwave Conference, Madrid, Spain, Sep. 6-9, 1993.

W. 0. Schlosser, "Noise in Mutually Synchronized Oscillators," IEEE Trans. Microwave Theory Tech., vol. MTT-16, pp. 732-737, Sep. 1968.

WA. Pucel, W. Struble, R Hallgren, U.L. Rohde, "A General Noise Dc-embedding Procedure for Packaged Two-Port Linear Active Devices," IEEE Transactions on MTT, vol. 40, No. 11, pp. 2013-2024, Nov. 1992.

Wing Shing Chan et al: "The design of oscillators using the cascode circuit" Circuits and Systems, 1994, vol. 5, pp. 689-692, May 30, 1994.

Y. Baeyens et al., "Compact InP-based HBT VCOs with a Wide Tuning Rnge at W-Band,"IEEE Trans. MTT, vol. 48, pp. 2403-2408, Dec. 2001.

Y. Sun, T. Tieman, H. Pflung, and W. Velthius, "A Fully Integrated Dual-Frequency Push-Push VCO for 5.2 and 5.8GHz Wireless Applications," Microwave Journal., pp. 64-74, Apr. 2001.

Yu-Lung Tang and Huei Wang, "Triple-Push Oscillator Approach: Theory and Expirements," IEEE- JSS, vol. 36, pp. 1472-1479, Oct. 2001.

K. Poddar, A Novel Approach for Designing Integrated Ultra Low Noise Microwave Wideband Voltage-Controlled Oscillators, Dec. 14, 2004.

* cited by examiner

INTEGRATED LOW NOISE MICROWAVE WIDEBAND PUSH-PUSH VCO

CROSS-REFERENCE TO RELATED APPLICATIONS

This application claims the benefit of the filing date of U.S. Provisional Patent Application Nos. 60/527,957, filed Dec. 9, 2003, 60/528,670, filed Dec. 11, 2003, and 60/563,481 filed Apr. 19, 2004, the disclosures of which are hereby incorporated herein by reference. This application is also a continuation-in-part of U.S. patent application Ser. No. 10/937,525 filed Sep. 9, 2004, the disclosure of which is incorporated herein by reference, which additionally claims the benefit of the filing date of U.S. Provisional Application Nos. 60/501,371, filed on Sep. 9, 2003, and 60/501,790, filed on Sep. 10, 2003, 60/527,957, filed Dec. 9, 2003, 60/528,670, filed Dec. 11, 2003, and 60/563,481, filed Apr. 19, 2004, the disclosures of which are hereby incorporated herein by reference.

BACKGROUND

A voltage controlled oscillator (VCO) or oscillator is a component that can be used to translate DC voltage into a radio frequency (RF) voltage or signal. In general, VCOs are designed to produce an oscillating signal of a particular frequency 'f' corresponding to a given tuning voltage. The frequency of the oscillating signal is dependent upon the magnitude of a tuning voltage $V_{tune}$ applied to a tuning diode network across a resonator circuit. The frequency 'f' may be varied from $f_{min}$ to $f_{max}$ and these limits are referred as the tuning range or bandwidth of the VCO. The tuning sensitivity of the VCO is defined as the change in frequency over the tuning voltage and it is desirable to tune the VCO over a wide frequency range with a small tuning voltage range.

A high frequency signal can be generated either by an oscillator operating at a fundamental frequency or a harmonic oscillator. An oscillator operating at the fundamental frequency typically suffers from a low Q-factor, insufficient device gain and higher phase noise at a high frequency of operation. In contrast, harmonic oscillators may be operated at a lower frequency, and generally include a high Q-factor, high device gain and low phase noise. Harmonic oscillators, however, are generally more costly and typically employ YIG resonators to achieve their operational benefits.

The cascade structure and the parallel structure are the two configurations known for the harmonic oscillators. The cascade structure supports second-harmonic oscillation based on frequency-doubling. On the other hand, the parallel structure supports $N^{th}$ harmonic frequency oscillations (N-push/push-push oscillator topology as a $N^{th}$ harmonic oscillator) based on the coupled-oscillator approach. The frequency doubler and other means of up-conversion may provide a practical and quick solution to generate a high frequency signal from an oscillator operating at a lower frequency, however, they may also introduce distortions and provide poor phase noise performance.

The magnitude of the output signal from a VCO depends on the design of the VCO circuit and the frequency of operation is in part determined by a resonator that provides an input signal. Clock generation and clock recovery circuits typically use VCOs within a phase locked loop (PLL) to either generate a clock from an external reference or from an incoming data stream. VCOs are therefore often critical to the performance of PLLS. In turn, PLLs are essential components in communication networking as the generated clock signal is typically used to either transmit or recover the underlying service information so that the information can be used for its intended purpose. PLLs are particularly important in wireless networks as they enable the communications equipment to quickly lock-on to the carrier frequency onto which communications are transmitted.

The popularity of mobile telephones has renewed interest in and generated more attention in wireless architectures. This popularity has further spawned renewed interest in the design of low noise wideband oscillators. The recent explosive growth in the new families of cellular telephones and base stations using universal mobile telephone systems (UMTS) has stirred a need for developing an ultra-low noise oscillator with a fairly wide tuning range. The demands of wideband sources have generally increased telescopically because of the explosive growth of wireless communications. In particular, modern communication systems are typically multi-band and multi-mode, therefore requiring a wideband low noise source that preferably allows simultaneous access to DCS 1800, PCS 1900 and WCDMA (wideband code division multiple access) networks by a single wideband VCO.

The dynamic operating range and noise performance of a VCO may limit or affect the performance of the PLL itself, which in turn may affect the performance of the device in which the PLL is employed, e.g., RF transceivers, cell phone, modem card, etc. Broadband tunability of VCOs represents one of the more fundamental tradeoffs in the design of a VCO, impacting both the technology and the topology used. The dynamic time average quality factor (i.e., Q-factor) of the resonator, as well as the tuning diode noise contribution, affect the noise performance of a VCO. Furthermore, the dynamic loaded Q is, in general, inversely proportional to the operating frequency range of the VCO.

Despite the continuous improvement in VCO technology, low phase noise typically remains a bottleneck and poses a challenge to RF transceiver (transmitter—receivers) design. This is typically considered due to the more demanding parameters of the VCO design: low phase noise, low power consumption and wide frequency tuning range.

In LC-resonator based VCOS, phase noise and power consumption typically depend primarily on the time average loaded Q-factor of the resonator circuit and the non-linearities associated with the tuning network, which typically employ varactors. The frequency tuning range is determined by the usable capacitive tuning ratio of the varactor and parasitic associated with the tuning network because the parasitic deteriorates and limits the effective tuning capability of the varactor at a high frequency. As the loss-resistance of the tuning network (e.g., varactor and resonator) determines the quality factor, attention is usually paid to the resistive behavior. The frequency range over which a coupled resonator circuit can be tuned by means of the tuning diode depends on the useful capacitance ratio of the tuning diode and on the parallel and series capacitance present in the circuit.

As the frequency for wireless communication shifts to higher and higher frequency bands, generation of an ultra-low noise, wideband, thermally stable and compact signal source at a relatively low cost becomes more and more challenging due to the frequency limitations of the active devices and broadband tunability of the tuning diode. In the past, wide tuning range and good phase noise performance were generally considered to be opposing requirements due to the problem of the controlling the loop parameters and the dynamic loaded Q of the resonator over the range of wideband operation.

Typically, the phase noise of a microstrip line resonator-based wideband VCO is −80 dBc/Hz @10 KHz (kilo-hertz) for a frequency band of 1600–3200 MHz (mega hertz) operating at 15V (volts), 45 mA (milli-ampere). A YIG resonator based VCO offers wideband tunability with an external DC magnetic field, but at a high price. In addition, the YIG resonator based VCO is not amenable to integration in chip form.

Thus, there is a need for a wideband oscillator, preferably having octave-band tunability, that offers a cost-effective alternative to the YIG resonator based wideband VCO in the frequency range of the L (0.95–1.5 GHz), S (1.7–2.3 GHz), and C (4–6 GHz) bands.

SUMMARY OF THE INVENTION

In one aspect the present invention provides a topology that supports wide-band tunability in a compact size, which is amenable for implementation in integrated circuit form.

In another aspect, the present invention is an oscillator preferably comprising a first device having first, second and third terminals and a second device having first, second and third terminals. In accordance with this aspect of the present invention, the oscillator preferably includes a phase detector coupled to the circuitry and operable to dynamically compensate for phase errors that occur between the first device and the second device.

Further in accordance with this aspect of the present invention, the oscillator further comprises circuitry comprising tunable coupled resonator networks coupled to the first terminals of each of the devices through a tuning voltage network. The voltage of the tuning network may be preferably adjusted to tune an output signal of the voltage controlled oscillator over at least an octave frequency band.

Further in accordance with this aspect of the present invention, the oscillator further comprises a bias network coupled between the first and second terminals of the first and second devices.

Further still, the oscillator desirably includes a dynamically tuned combiner network coupled between the second terminals of each of the devices to combine signals present at the second terminals into an output signal tunable over an operating frequency range that is twice the fundamental frequency.

The first and second devices may each comprise bipolar or field effect transistors. Generally, the first and second devices may comprise any active device having three terminals and that provides a 180 degree phase shift between any two terminals.

Further in accordance with this aspect of the present invention, the oscillator is desirably implemented in an integrated circuit package.

In another aspect, the present invention is an oscillator. The oscillator comprises first and second oscillators arranged in a push-push configuration and first and second tuning diode networks coupled to the first and second oscillators for dynamically adjusting the fundamental frequency of the oscillation signals output from the first and second oscillators. The oscillator further desirably comprises a phase detector integrated with the first and second tuning diode networks for dynamically compensating for phase errors between each oscillator during wideband operation.

In accordance with this aspect of the present invention, the voltage of the tuning network may be desirably adjusted to tune the frequency of the fundamental frequency of each output signal over an octave frequency band.

In accordance with this aspect of the present invention, the tunable resonator network circuitry desirably comprises a pair of micro-strip coupled resonators arranged in a horse-shoe configuration. In addition, the oscillator may desirably include a dynamically tuned combiner network for combining each of the output signals to produce a final output signal having a frequency at twice the fundamental frequencies of each output signal.

In another aspect, the present invention is a communication device. The device preferably includes a phase lock loop for generating a clock signal used to transmit or recover information communicated from or to the device. The phase lock loop preferably includes a voltage controlled oscillator for generating the clock signal. Preferably, the voltage controlled oscillator comprises first and second oscillators arranged in a push-push configuration; first and second tuning diode networks coupled to the first and second oscillators for dynamically adjusting a fundamental frequency of output signals of the first and second oscillators; and a phase detector integrated with the first and second tuning diode networks for dynamically compensating for phase errors between each oscillator during wideband operation.

In accordance with this aspect of the present invention, the communication device may comprise a wireless device including a cell phone, a personal digital assistant, or a radio transceiver. In general, the communication device may comprise any device that uses an oscillator to either transmit or receive information or as a timing source.

In a further aspect, the present invention is circuitry for a voltage controlled oscillator. The circuitry preferably comprises a pair of oscillators coupled together in a push-push configuration. The circuitry further preferably includes a phase detector integrated with a tuning diode for dynamically compensating for phase errors between each oscillator during wideband operation.

Further in accordance with this aspect of the present invention, the circuitry also desirably includes respective dynamically tunable coupled resonator networks coupled to each oscillator that allows for wideband operation.

In an additional aspect, the push-push coupled oscillator configuration may be further extended to include an N-push oscillator configuration in accordance with the present invention to provide a wideband tunable oscillator in the L, S and C bands.

In accordance with a further aspect of the present invention, the free running frequencies of the two oscillators in the coupled oscillator systems are not identical because of tolerances in their respective circuit component values. However, injection locking may be advantageously used to lock the frequencies of the two oscillators to each other. The maximum frequency range over which injection locking can occur is inversely proportional to the external Q of the oscillators. Therefore, in the case of oscillators having low values of external Q, injection locking may occur even with a large discrepancy in the free running frequencies of each oscillator.

In a further aspect of the present invention, a voltage controlled oscillator is provided that includes a pair of oscillators in a push-push configuration. The voltage controlled oscillator preferably includes a phase detector integrated with a tuning diode for dynamically compensating for phase errors between each oscillator during wideband operation. In accordance with a further aspect of the present invention, the oscillator may be implemented in an N-push configuration to produce a harmonic signal of $N^{th}$ degree.

In accordance with another aspect of the present invention, a voltage controlled oscillator is provided. The oscillator preferably comprises a first device having first, second and third terminals, a second device having first, second and third terminals and a tunable phase coupling network preferably coupled to the first terminals of the first and second devices. The voltage controlled oscillator further desirably includes respective bias networks coupled between each of the first and third terminals of the first and second devices. Most desirably, each of the bias networks is coupled to each other.

In accordance with this aspect of the present invention, a combiner network is preferably coupled between each of the third terminals of the first and second devices. The combiner network is preferably operable to combine the output frequency of a signal present at each of the third terminals of the first and second devices. Most preferably, a phase detector is coupled between each of the third terminals of the first and second devices. The voltage controlled oscillator may further include first and second dynamically turned coupled-resonator networks, each coupled between the phase detector and a tuning diode circuit and to each of the second terminals of the first and second devices. Most preferably, the phase detector and tuning diode are operable to dynamically compensate for phase errors detected by the phase detector.

Further in accordance with this aspect of the present invention, a tunable output at approximately twice the frequency of the signal present at each of the third terminals is available as an output of the combiner network.

In a further aspect, the present invention provides a method for identifying the effects that may limit the wideband tuning range of a VCO. These effects may then be used to minimize the phase shift and allow for broadband tunability.

In accordance with an aspect of the present invention, a wideband voltage controlled oscillator may be designed and fabricated which can satisfy the present demands for a low noise oscillator having a wide tuning range, less harmonic content, lower manufacturing tolerance and which can be miniaturized.

An aspect of the present invention further allows for the implementation of a compact, power efficient, ultra low noise and low thermal drift microwave wideband VCO, for example, operating at 1000–2000/2000–4000 MHz.

In a further aspect, the present invention allows for implementation of a system of coupled resonators that advantageously enhance the time average loaded Q factor over the octave band and extend the frequency band of operation in the 1000–2000/2000–4000/4000–8000 MHz band.

In yet still a further aspect, the present invention provides a general implementation for a wideband dynamically tunable coupled oscillator for an extended frequency range of operation that improves the performance of the push-push/N-push oscillator configuration.

An additional aspect of the present invention is a telephone. The telephone preferably comprises a phase lock loop for generating a clock signal used to transmit or recover information signals communicated by the telephone. The phase lock loop preferably comprises a voltage controlled oscillator for generating the clock signal. The voltage controlled oscillator preferably comprises a first device having first, second and third terminals; a second device having first, second and third terminals; circuitry comprising tunable or coupled resonator networks coupled to the first terminal of each of the devices through a tuning voltage network; and a phase detector coupled to the circuitry and operable to dynamically compensate for phase errors that occur between the first device and the second device. Most preferably, the voltage of the tuning network may be adjusted to tune an output signal frequency of the voltage controlled oscillator.

Further in accordance with this aspect of the present invention, the telephone preferably comprises a cellular telephone. In addition, the information may include voice or data. The data may include any type of digital data including images, sound, or text.

In another aspect, the present invention is a method for tuning an oscillator output signal. The method preferably comprises arranging first and second oscillators in a push-push configuration and adjusting a fundamental frequency of output signals of the first and second oscillators by tuning first and second tuning diode networks coupled to the first and second oscillators. In addition, the method further preferably comprises compensating for phase errors between each oscillator through a phase detector coupled to the first and second oscillators.

In accordance with this aspect of the present invention, the method may further comprise adjusting a voltage of the tuning network to change the fundamental frequency of each output signal over an octave frequency band. Further still, the method may also comprise combining each of the output signals to produce a final output signal having a frequency of twice the fundamental frequency of each output signal.

DESCRIPTION OF THE PREFERRED EMBODIMENTS

In one aspect, the present invention relates to circuitry for voltage controlled oscillators (VCOs). Preferably, such oscillators have one or more of the following characteristics: ultra-low phase noise performance, power efficient, low cost, tunable with more than octave-band tunability and amenable to integrated chip form.

Figure 1:
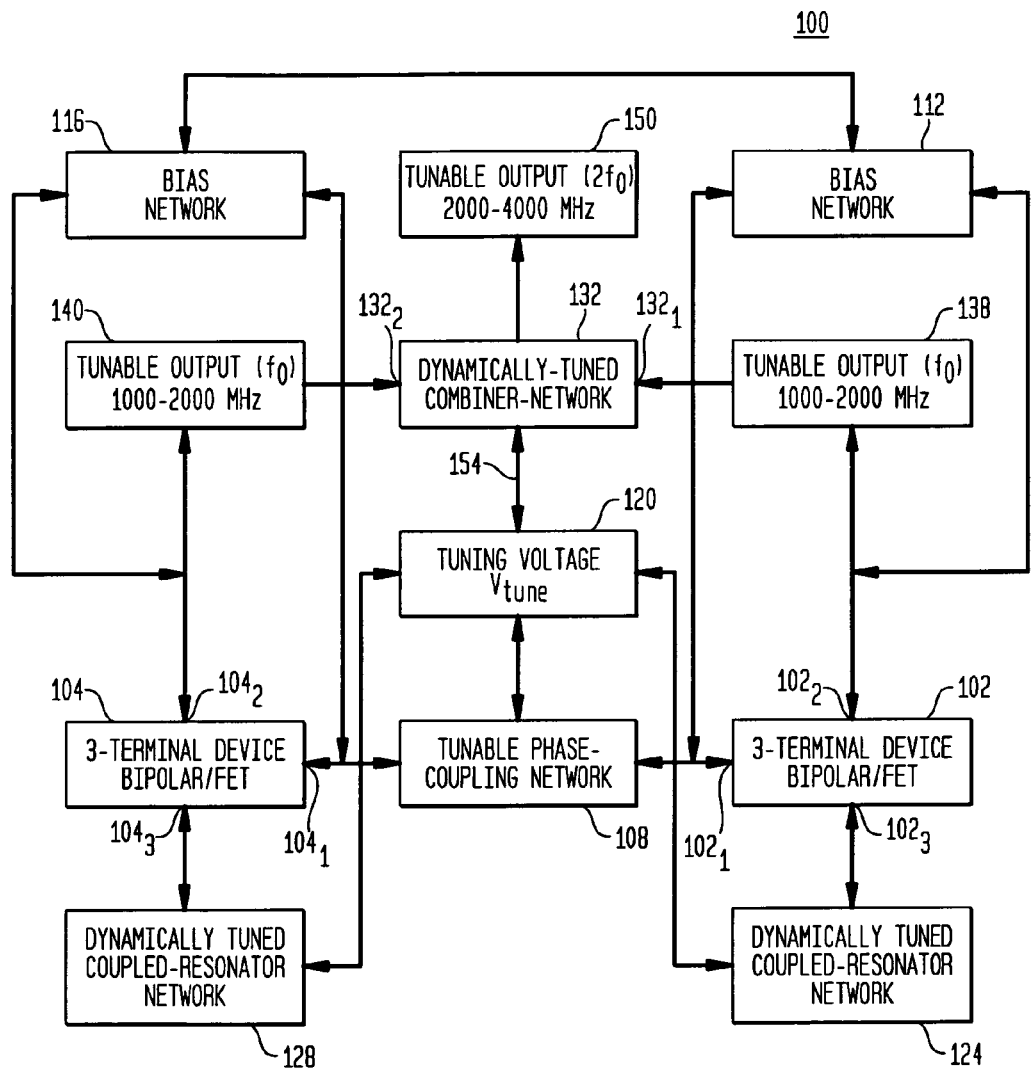
FIG. 1 is a functional block diagram illustrating the modules of a voltage controlled oscillator (VCO) in accordance with an aspect of the present invention.

FIG. 1 illustratively depicts a functional block diagram of the modules of a low noise octave-band voltage controlled oscillator (VCO) 100 in accordance with an aspect of the present invention. The VCO 100 is shown as operating in the frequency range of 1000–2000 MHz/2000–4000 MHz (i.e., 1 GHz–2 GHZ/2 GHz–4 Ghz), although the individual circuit parameters, e.g., resistor values, capacitor values, etc., may be selected and arranged so that the circuit operates at a different fundamental frequency and produces a tunable output at both the fundamental frequency and second harmonic. In addition, the topology shown in FIG. 1 may be extended from a push-push type configuration, such as 1 GHz–2 GHz/2 GHz–4 GHz/4 GHz–8 GHz/8 GHz–16 GHz, which allows the operating frequency of the oscillator to be extended beyond the cut-off frequency of the active device.

As FIG. 1 shows, the VCO/oscillator 100 includes a pair of three terminal devices, 102 and 104, which are coupled together through the other modules shown. More particularly, each device 102 and 104 includes three terminals, illustrated as $102_1$, $102_2$ and $102_3$ and $104_1$, $104_2$ and $104_3$, respectively. The first terminal $102_1$, of first device 102 is coupled to a tunable phase coupling network 108 and bias network 112. The tunable phase coupling network 108 is also coupled to the first terminal $104_1$ of the second device 104, which is also coupled to a bias network 116 at terminal $104_1$. The tunable phase coupling network 108 is also coupled to tuning voltage block 120. The tuning voltage block 120 is coupled to dynamically tuned coupled-resonator networks, 124, 128, which are respectively coupled to the third terminals $102_3$, $104_3$ of each of the three terminal devices.

As discussed in U.S. application Ser. No. 10/912,209, the disclosure of which is incorporated by reference herein, the three-terminal devices preferably comprise a bipolar transistor and wherein the first, second and third terminals of the three terminal device comprise either the collector, base and emitter nodes of the bipolar transistor. On the other hand, the three terminal device may comprise a field effect transistor wherein the first, second and third terminals of the three terminal device either comprise the collector, base and emitter nodes of the field effect transistor. As a general matter, the three terminal device desirably includes any three terminal device which is operable to provide a 180 degree phase shift between the first and second terminals.

The tuning voltage block 120 is further coupled to a dynamically-tuned combiner network 132, which includes two input ports, $132_1$ and $132_2$. Each of the input ports $132_1$ and $132_2$ accepts input signals 138, 140 present at the second terminals $102_2$ and $104_2$ of each of the devices. The dynamically-tuned combiner network 132 combines the input signals 138, 140 and produces a signal 150 operating at the second harmonic of the input signals 138, 140.

Figure 2:
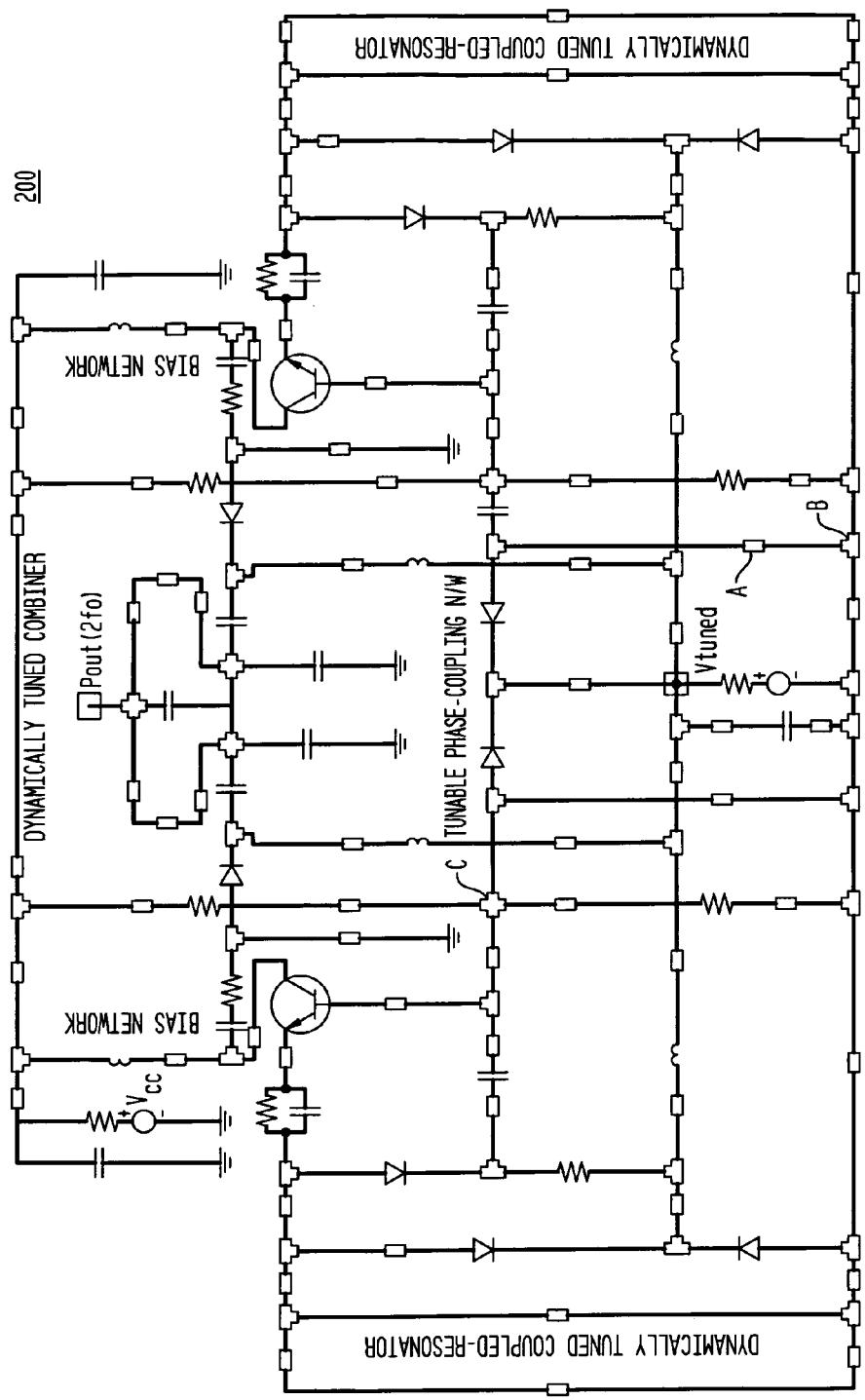
FIG. 2 is a schematic circuit diagram of a VCO in accordance with an aspect of the present invention.

The oscillator 100 preferably operates in the following manner. The circuit elements comprising the various modules, e.g., diodes, resistors, capacitors, resonators, etc., are selected so that each of the three terminal devices 102, 104 oscillate at a fundamental frequency, f0. As the voltage level of the tuning voltage module 120 is adjusted the fundamental frequency of operation, f0, appearing as input signals 138, 140 is tuned over the operating range of the oscillator, e.g., preferably octave-band. These signals 138, 140 are then combined in the combiner network 132 to produce a signal operating at twice the fundamental frequency, 2f0, and that is dynamically tuned as the voltage level of the tuning voltage module 120 is adjusted. A select portion of a signal 154 from the combiner network 132 is also fed back to the tuning block 120. A portion of the signal 154 is then fed to tunable phase coupling network 108 and used to dynamically tune the phase of the output signals 138, 140, so that each of these signals remain in phase during a tuning operation. In addition, a portion of the signal 154 is also fed to each of the dynamically-tuned coupled resonator networks 124, 128, so that the frequency, f0, present at block 138 is at the same frequency as the signal present at block 140. Accordingly, as the tuning voltage, Vtune, is adjusted, the frequency of the signals, f0, present at each of the terminals $102_2$ and $104_2$ are tuned over the operating frequency band through the coupled resonator networks 124, 128, while the phase coupling network 108 keeps the two devices 102, 104 operating in an anti-phase mode at the fundamental frequency, f0 (e.g., push-pull behavior), while the second harmonic, 2f0, interferes constructively (e.g., push-push behavior) over the octave band FIG. 2 depicts a schematic circuit diagram 200 of a VCO designed in accordance with the principles of FIG. 1 in accordance with an additional aspect of the present invention. In particular, FIG. 2 illustrates a dynamically tuned coupled-resonator network, dynamically tuned phase-coupling network and dynamically tuned combiner network for octave-band 2-Push/ Push-Push operation. As one of ordinary skill in the art may recognize, the rectangular blocks (e.g., A) in FIG. 2 (and the other circuit diagrams that comprise this disclosure) are transmission lines and coupling blocks (e.g., B or C) are three port (T-connector) or four port connecters or couplers that connected different circuit branches. Although FIG. 2 shows a 2-Push configuration the circuitry may be extended to an N-Push configuration and provide a tunable signal at N times the fundamental frequency of the sub-circuit's operation. The sub-circuits comprise the respective bias networks, resonator networks and three-terminal devices, which in this embodiment are depicted as bipolar transistors although FETs may be used also. The values of the individual circuit elements may be chosen so that the resulting output signal from the circuitry operates in the L, S and C band and is tunable over a desired frequency band, preferably octave-band. This configuration is intended to overcome the limitations of the fixed frequency operation of the push-push oscillator/N-push oscillator by including a tuning and phase controlling network over the desired frequency band (preferably octave-band).

Figure 3:
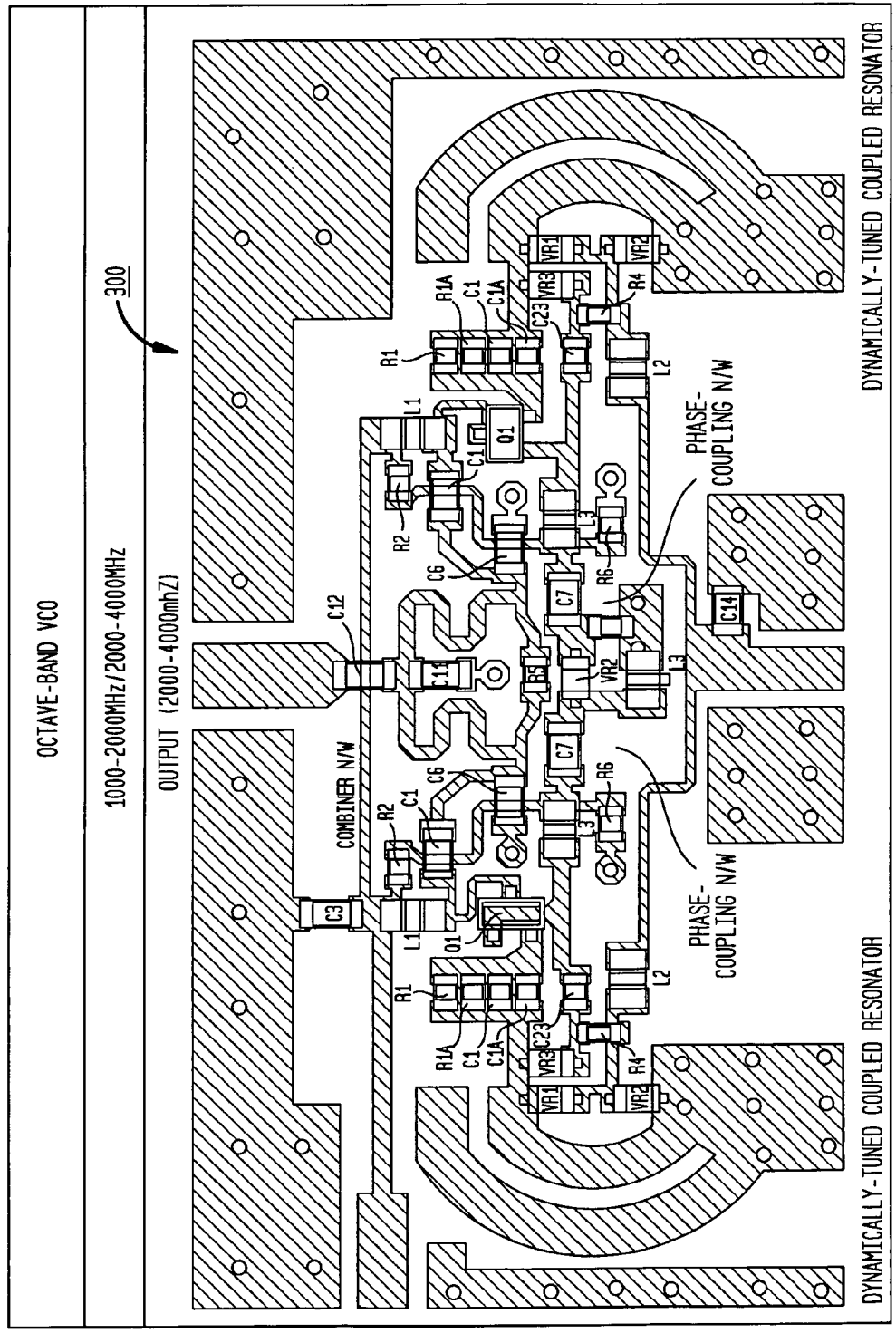
FIG. 3 is a schematic of an integrated circuit comprising a VCO in accordance with an aspect of the present invention.

FIG. 3 illustrates a schematic layout of an integrated circuit (IC) 300 designed in accordance with the schematic circuit diagram of FIG. 2 with the values of the various circuit elements chosen such that the fundamental frequency is tunable over the frequency range of 1000 MHz to 2000

MHz (1 GHz to 2 GHz). In addition, the circuitry 300 also provides an output that is tunable over the frequency range of 2000 MHz to 4000 MHz (2 GHz to 4 GHz). As FIG. 3 shows, the functional diagram of FIG. 1 and the circuitry of FIG. 2 are amenable to implementation as an integrated circuit. More particularly, the integrated circuitry of FIG. 3 includes a printed microstripline resonator and various discrete elements that may be preferably implemented in Roger material.

Figure 4:
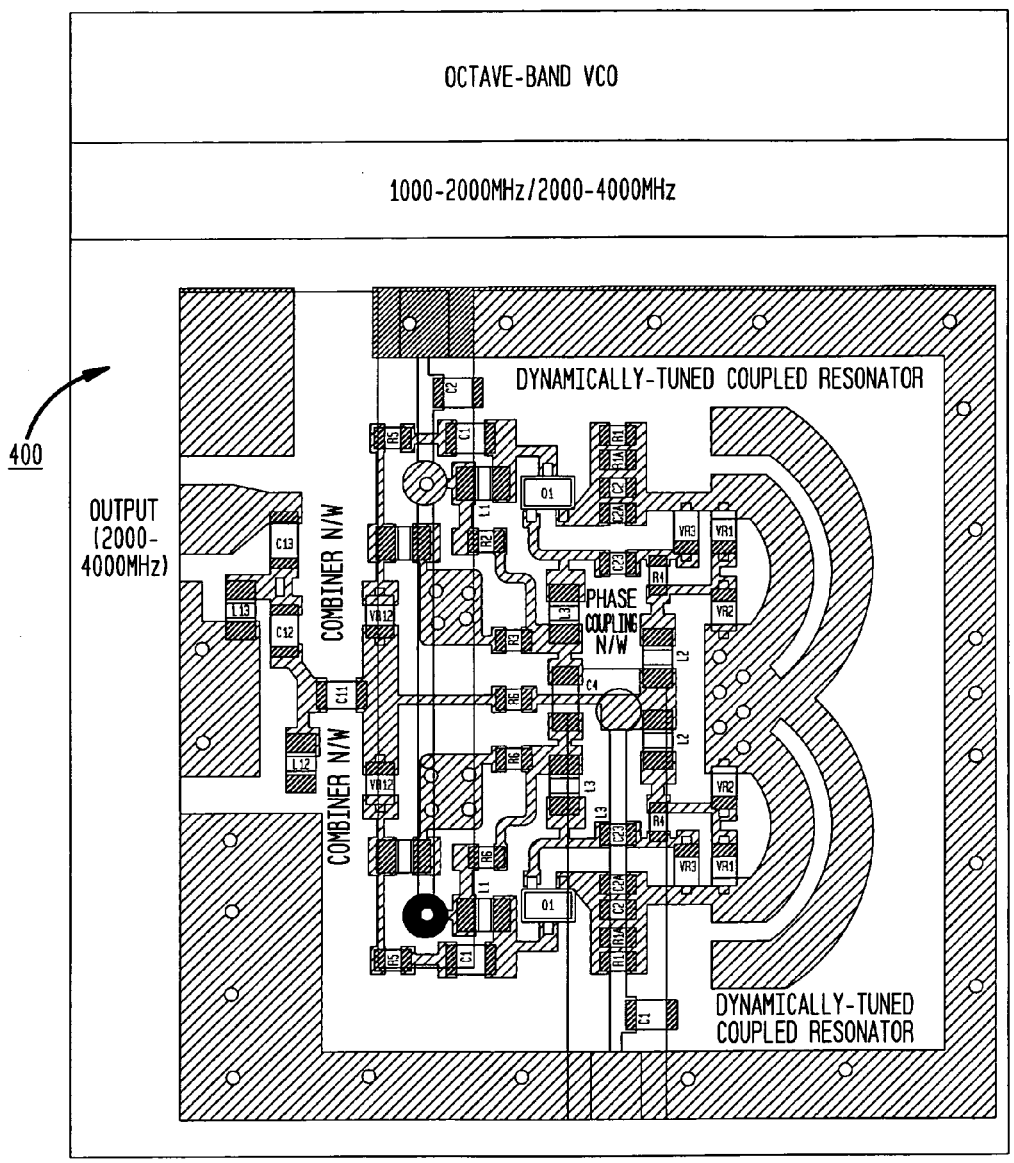
FIG. 4 is a schematic of an integrated circuit comprising a VCO in accordance with an aspect of the present invention.

FIG. 4 illustrates a schematic layout of another integrated circuit 400 in accordance with the schematic circuit diagram of FIG. 2. As in FIG. 3, the various components of FIG. 2 are chosen such that the fundamental frequency is tunable over the frequency range of 1 GHz to 2 GHz. In addition, the integrated circuit 400 also provides an output that is tunable over the frequency range of 2 GHz to 4 GHz. In accordance with this aspect of the present invention, the sub-circuits of each of the resonators are configured in a push-push topology and each of the dynamically tuned coupled resonators is provided in integrated circuit form. The form of the integrated circuit shown in FIG. 4 tends to be even more compact than that shown in FIG. 3.

As FIGS. 3 and 4 show, a VCO designed in accordance with the foregoing aspects of the present invention may be implemented in the form of a compact integrated circuit, such as integrated circuits 300 and 400. The integrated circuits 300 and 400 may be advantageously mounted to a printed circuit or wire board in wireless devices, such as cell phones or a personal digital assistant, where space is at a premium. In addition, these devices preferably include octave band tunability, which allows for their deployment in applications such as WCDMA.

Figure 5:
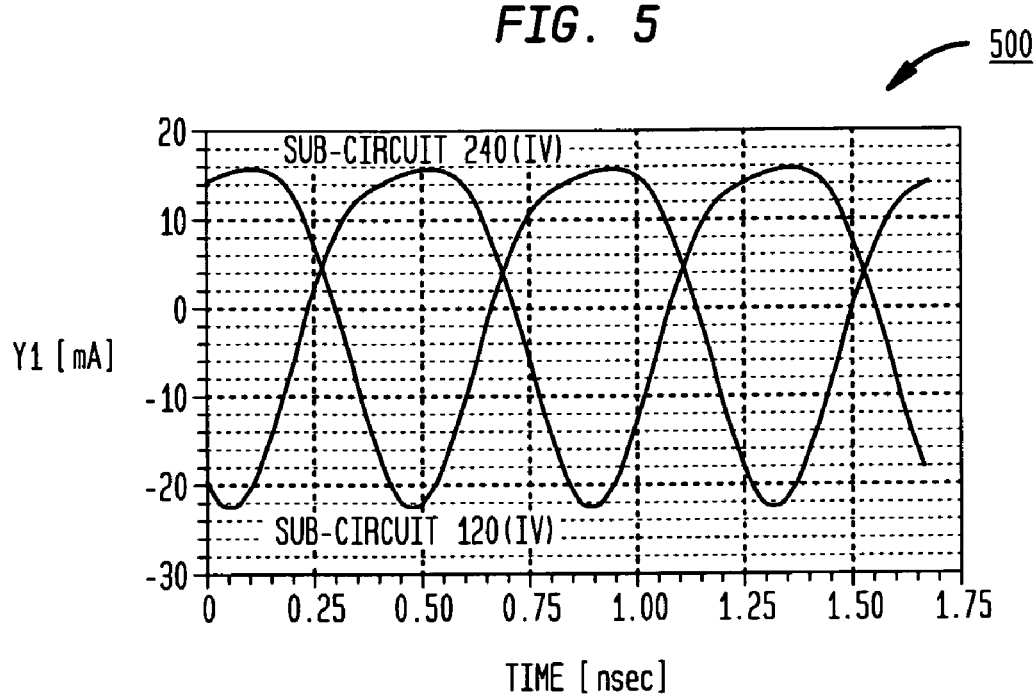
FIG. 5 is a plot of RF-base currents of the sub-circuits of FIG. 3 at the fundamental frequency of operation.

FIG. 5 illustrates a plot 500 of the RF-base currents of a voltage control oscillator of the type shown in FIG. 3 or 4 at the fundamental frequency of operation. As FIG. 5 shows, the RF-base currents are out of phase for the fundamental frequency of the operation, 1000–2000 MHz.

Figure 6:
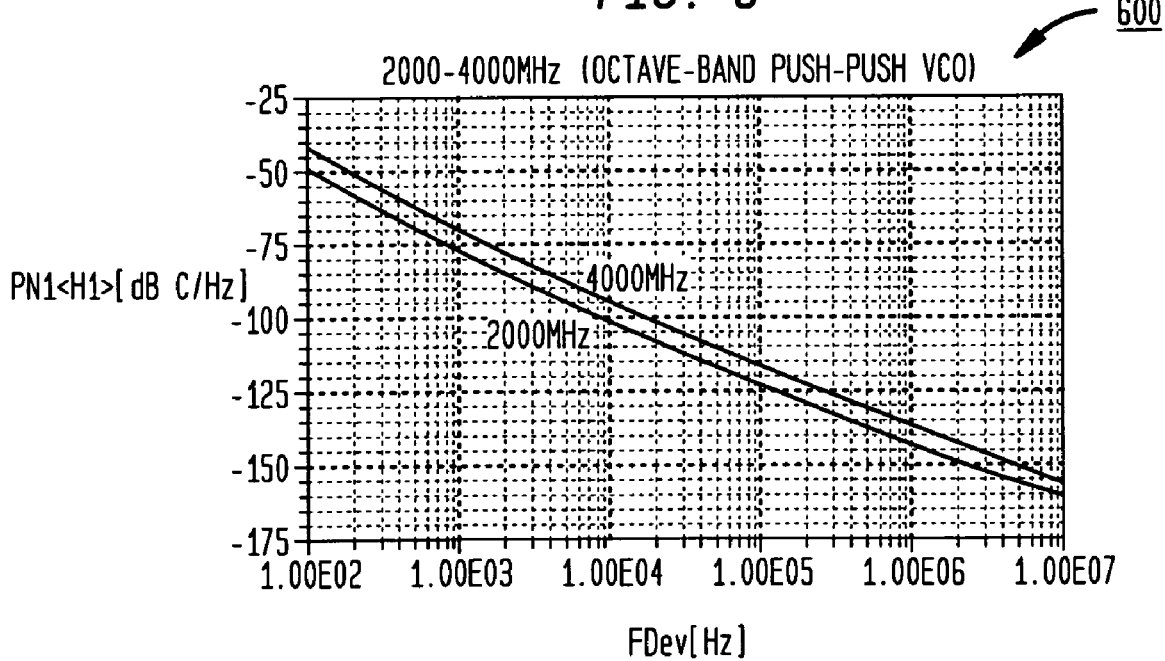
FIG. 6 shows a phase noise plot for a VCO over an octave-band frequency range of 2 GHz to 4 GHz in accordance with an aspect of the present invention.

FIG. 6 illustrates a typical phase noise plot 600 of an oscillator implemented in accordance with the circuitry illustrated in FIG. 2, 3 or 4 for the octave-band frequency range of 2000–4000 MHz. As FIG. 6 shows the phase noise of the oscillator is approximately −90 dBc/Hz at 10 KHz over for the frequency band of 2000–4000 MHz. However, the integrated circuits 300, 400 typically provide better than −95 dBc/Hz at 10 KHz over for the frequency band of 2000–4000 MHz.

Figure 7:
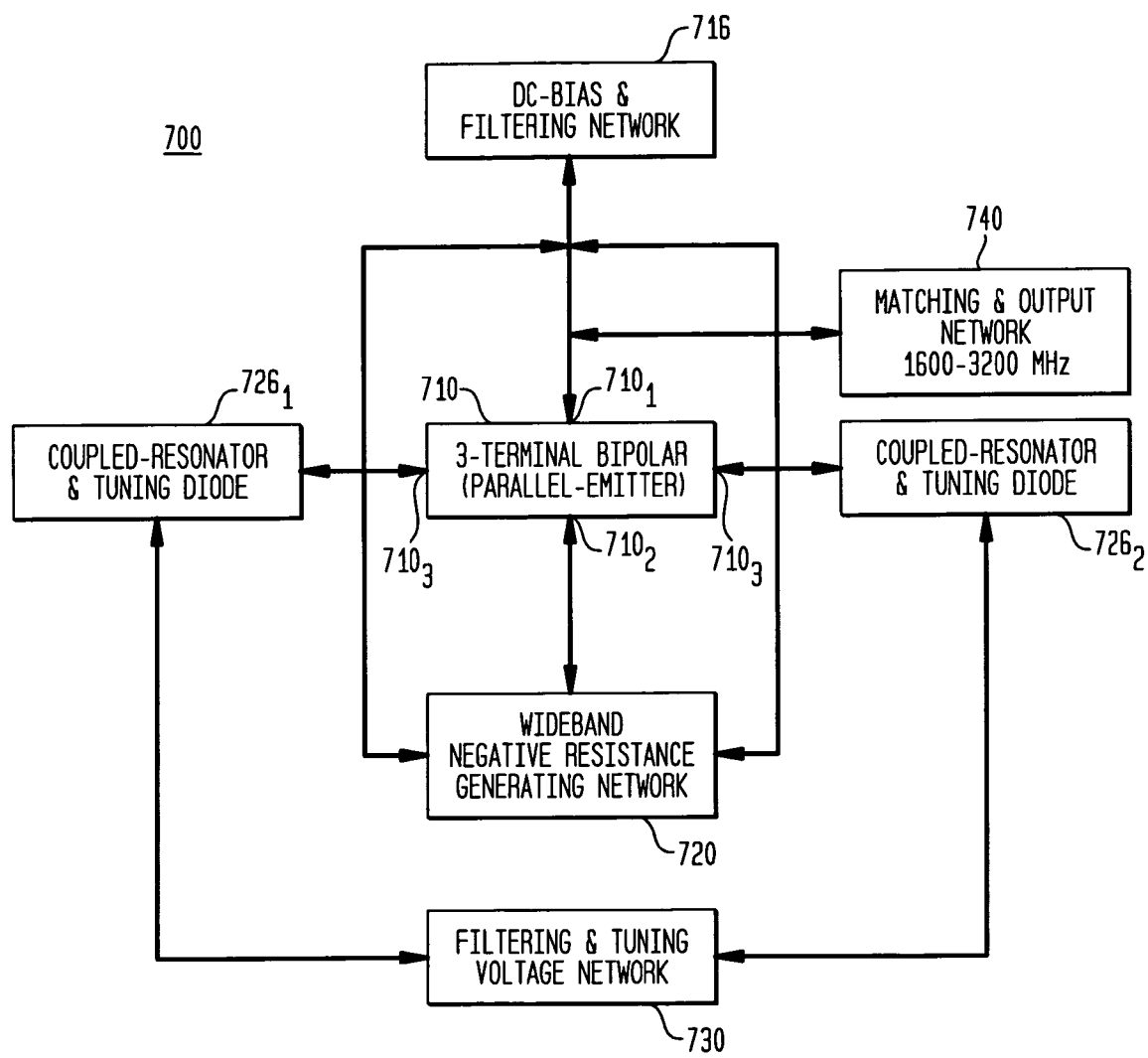
FIG. 7 is a functional block diagram illustrating the modules of a VCO in accordance with an aspect of the present invention.

FIG. 7 is a functional block diagram illustrating the modules of a low noise octave-band VCO 700 in accordance with an additional aspect of the present invention. As shown in FIG. 7, the VCO includes a three terminal device 710 that includes terminals $710_1$, $710_2$ and $710_3$. The device 710 is preferably configured as a parallel emitter transistor. The first terminal $710_1$ is coupled to a DC-bias and filtering network 716. The second terminal $710_2$ is coupled to a wideband negative resistance network 720, which is also coupled to the first terminal $710_1$, of the device 710. The third terminal $710_3$ of the device 710 is coupled to a pair of dynamically tuned coupled-resonator tuning diode networks $726_1$ and $726_2$ preferably through the parallel emitter of a three-terminal bipolar transistor. In FIG. 7, the third terminal $710_3$ is shown twice on the device in order to simply the diagram, yet while illustrating the parallel emitter configuration. A filtering and tuning voltage network 730 is coupled between the dynamically tuned coupled-resonator tuning diode networks $726_1$ and $726_2$. The output signal of the VCO 700 is taken from a matching and output network 740 coupled to the first terminal $710_1$, of the device.

In operation, the wideband negative resistance generating network 720 maintains a constant resistance over the tuning band of the oscillator 700. More particularly, the filtering and tuning network 730 is tuned to adjust the oscillation frequency of the device 710 through the coupled-resonator and tuning diode 726. As tuning occurs the negative resistance generating network 720 maintains uniform or constant negative resistance over the tuning band. In this way, the phase noise output of the oscillator may be maintained at a relatively low, e.g., ultra-low, level.

Figure 8A:
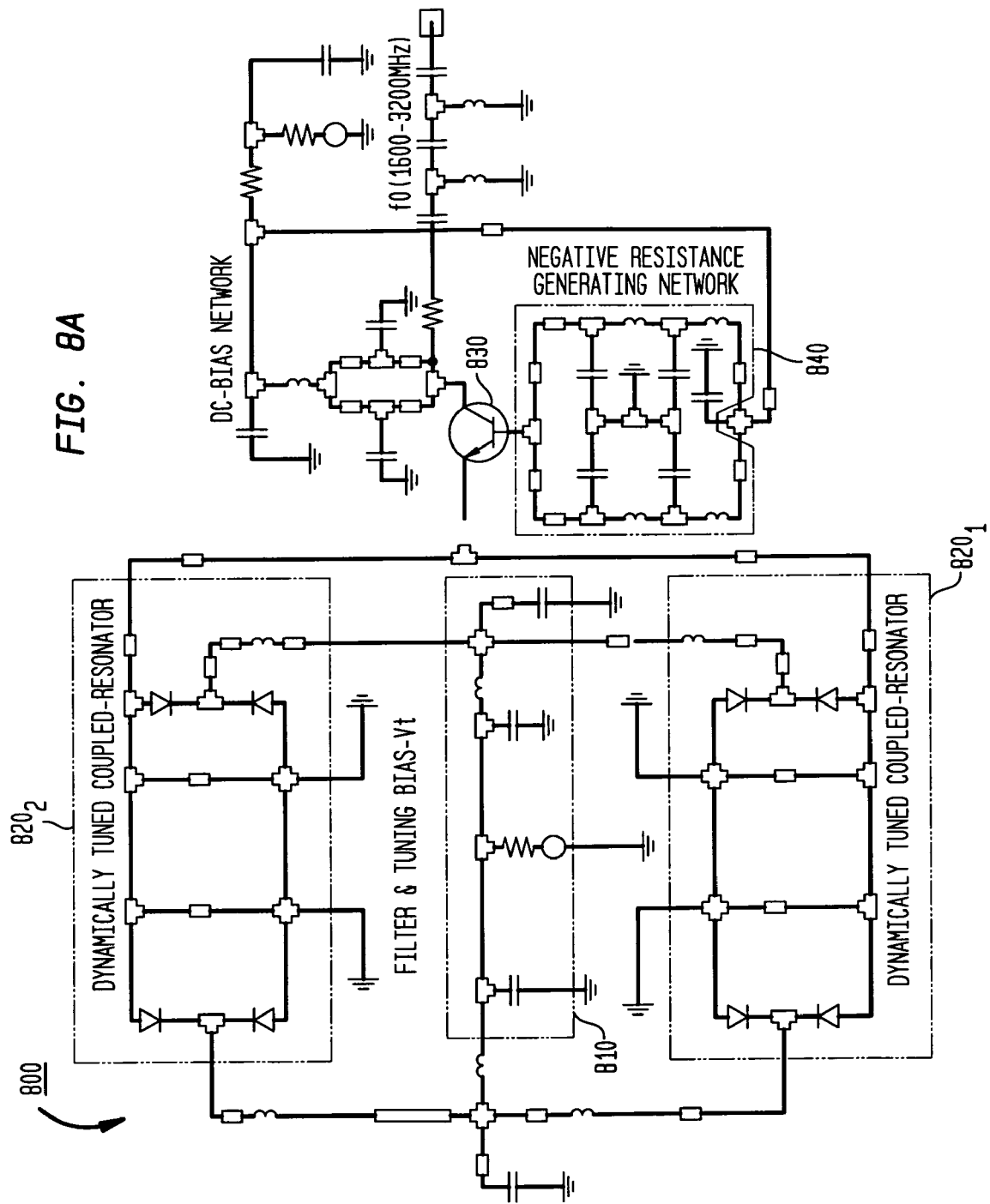
FIG. 8A is a schematic circuit diagram of VCO in accordance with an aspect of the present invention.

FIG. 8A shows a schematic circuit diagram 800 of a possible implementation of the functional diagram 700 of FIG. 7 in accordance with another aspect of the present invention. As FIG. 8A shows, a filter and tuning bias network 810 is integrated with a pair of coupled horse-shoe microstrip resonator (820, and $820_2$). The tuning network 810 and negative resistance generating network 840 allows the VCO to be tunable over more than an octave-band while maintaining a uniform phase-noise performance through the band. The circuit elements are preferably chosen to provide tunability over a 1600–3200 MHz frequency band. The circuit elements may also be chosen to allow for tunability over other octave bands as is discussed below.

Figure 8B:
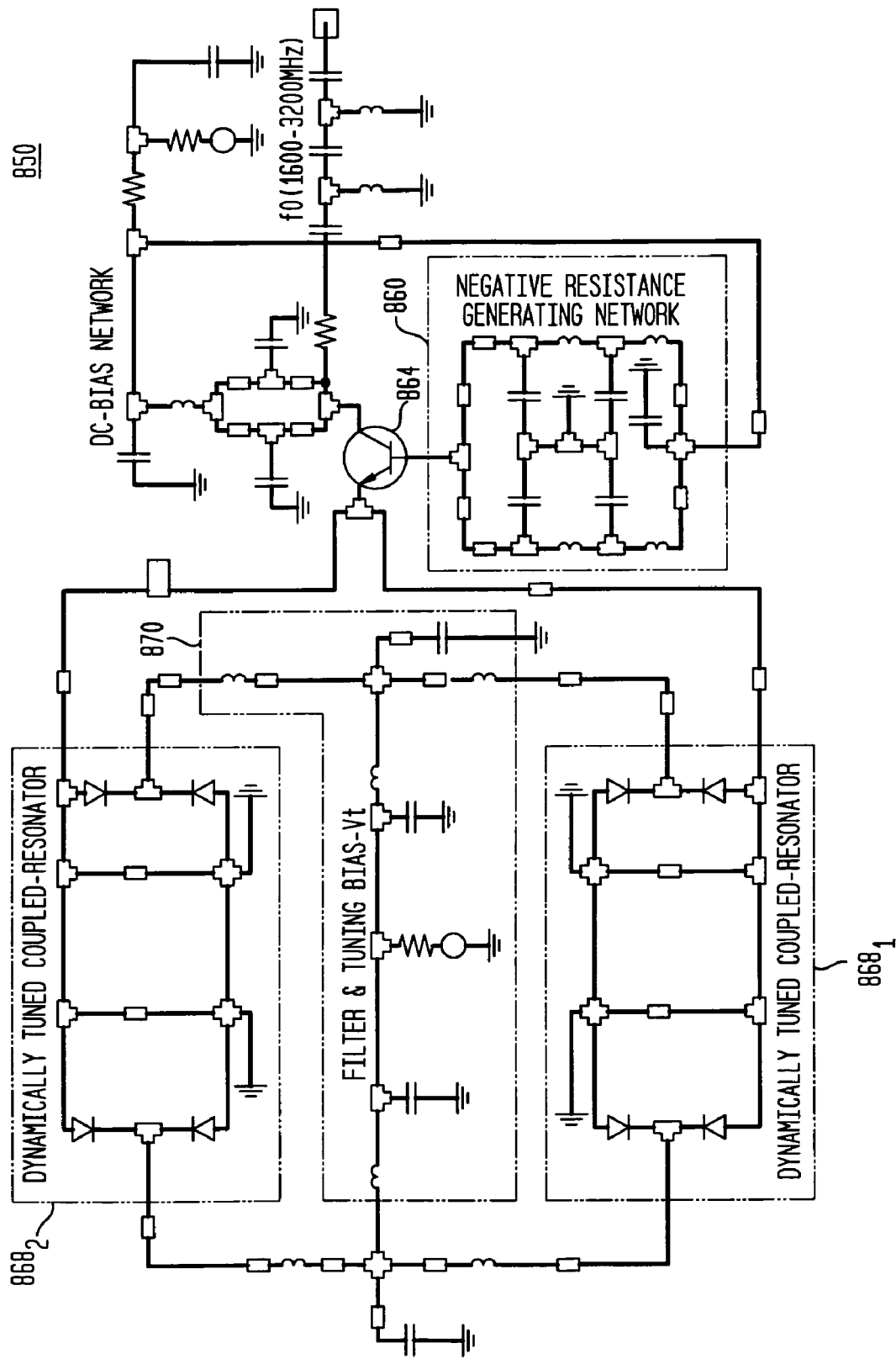
FIG. 8B is a schematic circuit diagram of VCO in accordance with an aspect of the present invention.

FIG. 8B illustrates a schematic circuit diagram 850 of a possible implementation of the functional diagram 700 of FIG. 7. The circuitry 850 of FIG. 8B includes a variable negative resistance generating network 860, which is preferably coupled to the base of a bipolar transistor 864. The transistor 864 is preferably arranged in a parallel emitter configuration with a pair of dynamically tuned coupled-resonators $868_1$, $868_2$ coupled in parallel to the emitter. A filter and tuning bias network 870 is coupled between the resonators $868_1$ and $868_2$ as shown. The negative resistance generating network includes a pair a variable capacitors that allow the negative resistance to be variable over the tuning range. This in turns allows the value of resistance provided by the network 860 to be tunable over the tuning range of the oscillator.

Figure 9:
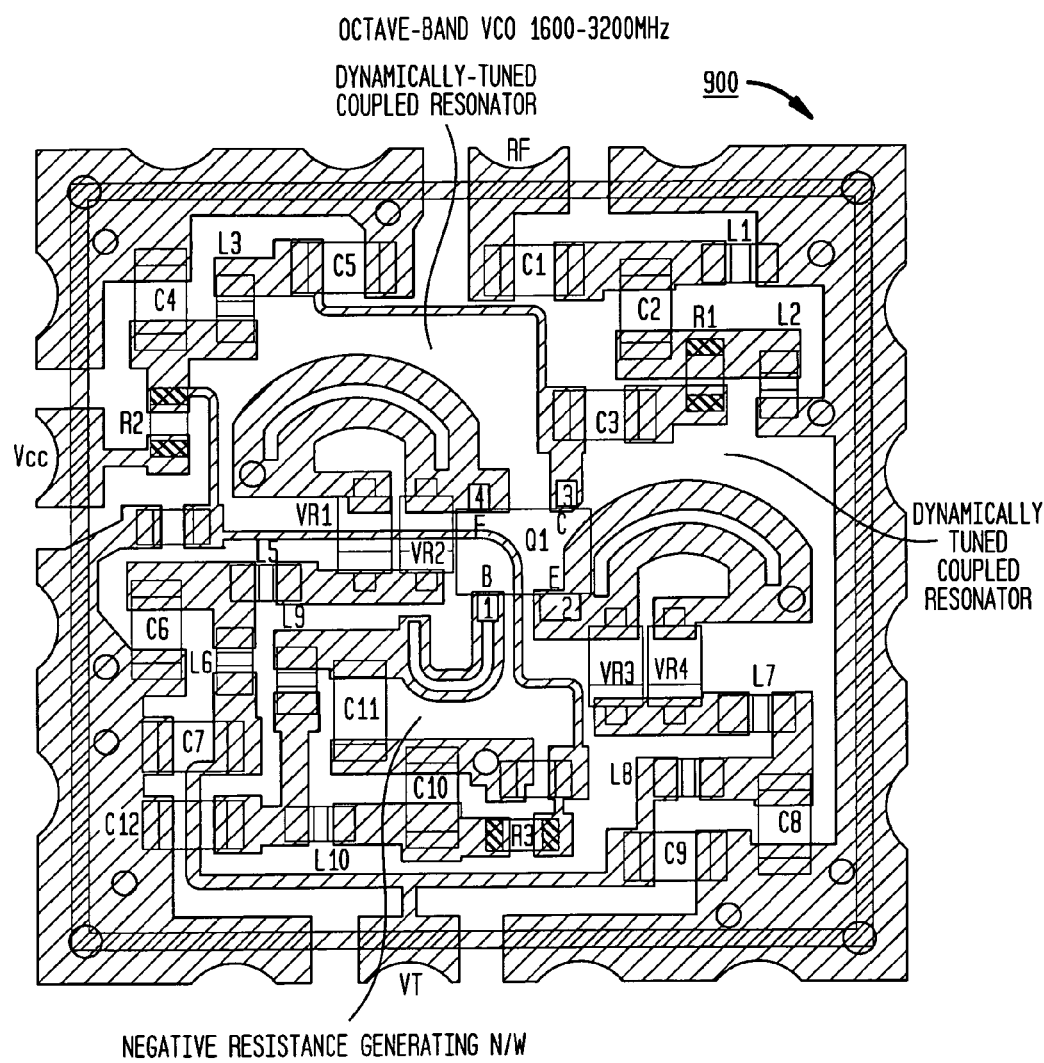
FIG. 9 is a schematic of an integrated circuit comprising a VCO in accordance with an aspect of the present invention.

FIG. 9 illustrates a schematic layout of an integrated circuit 900 designed in accordance with the embodiment illustrated FIG. 8A. The discrete elements and layout of the integrated circuit of FIG. 9 may be chosen to allow for more than octave band tunability over a 1.6 to 3.2 GHz operating frequency range.

Figure 10:
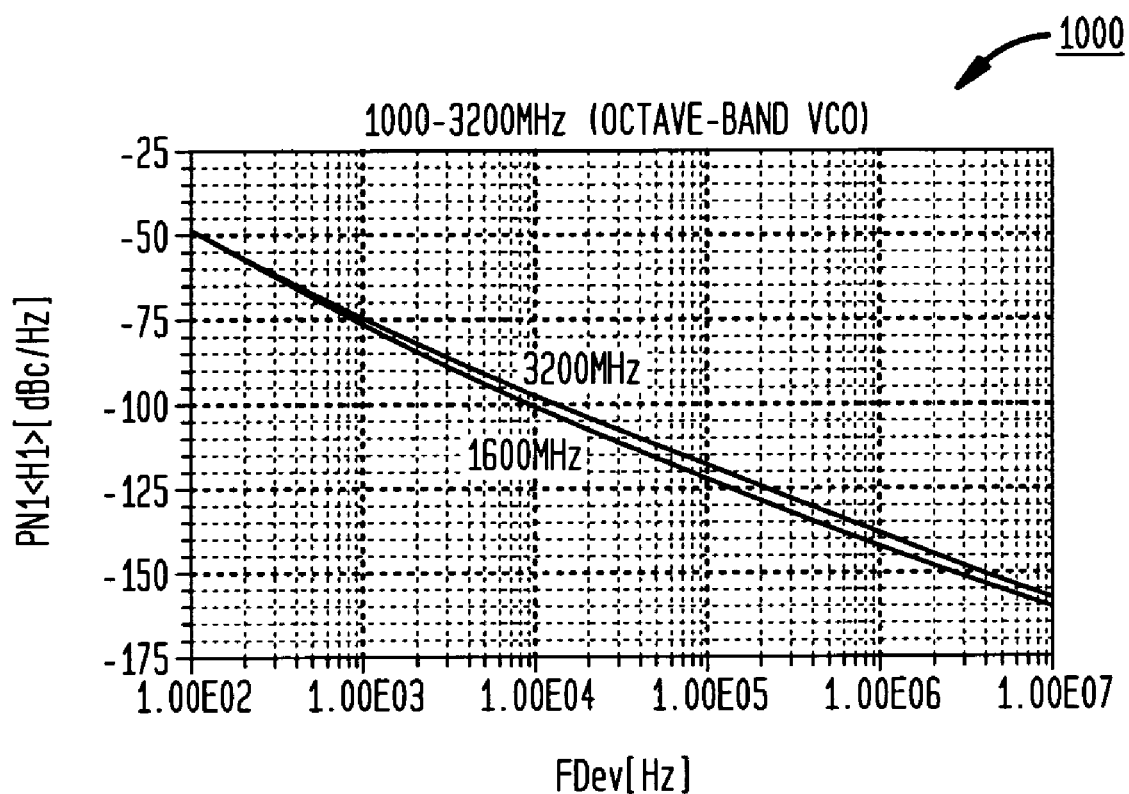
FIG. 10 illustrates a phase noise plot for the octave-band frequency range of a VCO in accordance with an aspect of the present invention.

FIG. 10 shows a phase noise plot 1000 for the octave-band frequency range of 1600–3200 MHz for the integrated circuit 900 of FIG. 9. As shown, the phase noise is approximately −95 dBc at 10 KHZ, however the phase noise is typically better than −100 dBc at 10 KHZ.

Figure 11:
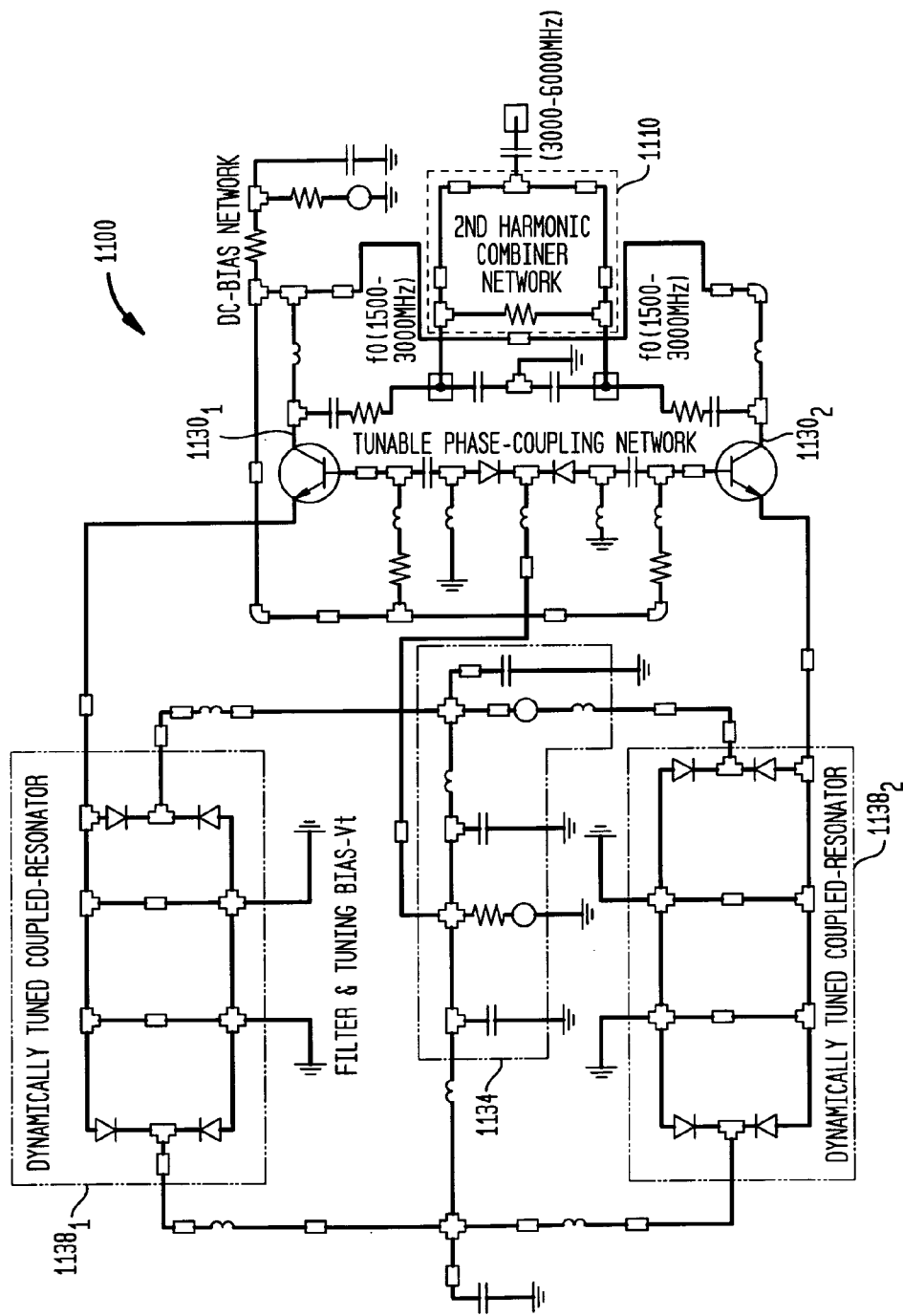
FIG. 11 is a schematic circuit diagram of VCO in accordance with an aspect of the present invention.

FIG. 11 depicts a schematic circuit diagram of a low noise octave band VCO 1100 operating in the frequency range of 3000–6000 MHz in accordance with an additional aspect of the present invention. The circuit diagram of FIG. 11 is implemented in accordance with the functional diagram of the FIG. 1, however the circuit elements comprising the various modules are selected so as to provide a fundamental frequency of operation of 1500 to 3000 MHz. Accordingly, the second harmonic combiner network 1110 combines the signal at the fundamental frequency produced at the collectors, $1130_1$ and $1130_2$, of the transistors to produce a signal that is tunable over the frequency band of 3000 to 6000 MHz.

As FIG. 11 also shows, a dynamic tuning network 1134 which is integrated with coupled horse-shoe microstrip resonators $1138_1$ and $1138_2$ is incorporated to get more than octave band tunability while maintaining a uniform phase noise performance throughout the band.

Figure 12:
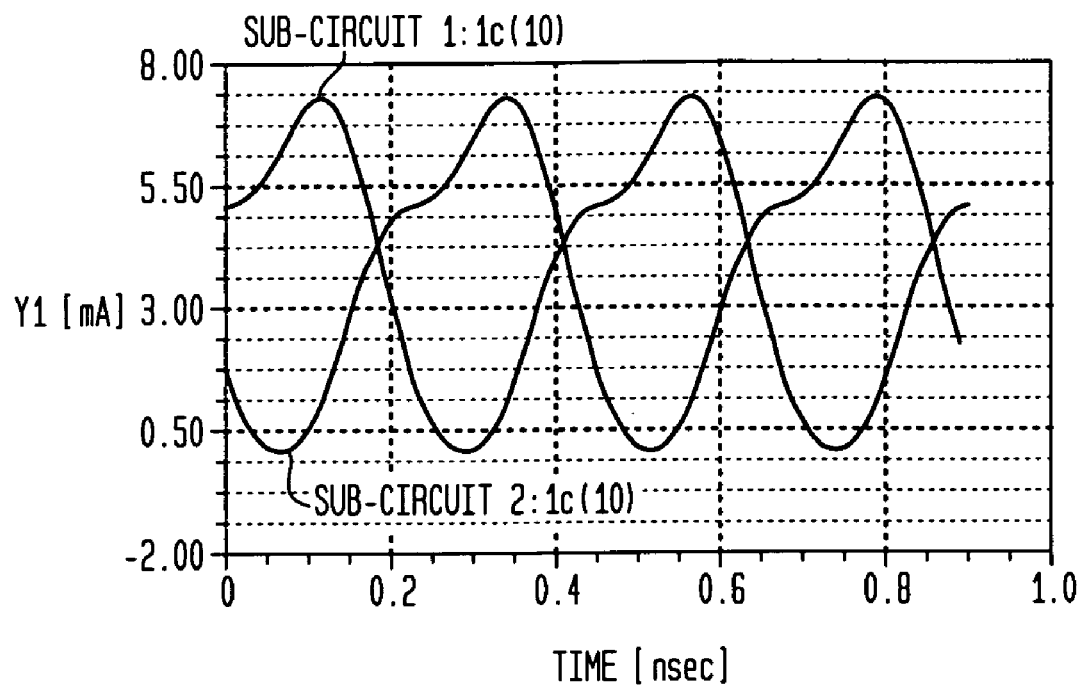
FIG. 12 is a plot of the RF-collector current of the circuitry depicted in FIG. 12.

FIG. 12 is a plot 1200 of the RF-collector current of both sub-circuits of FIG. 11, which are out of phase for the fundamental frequency of operation, 1500–3000 MHz.

Figure 13:
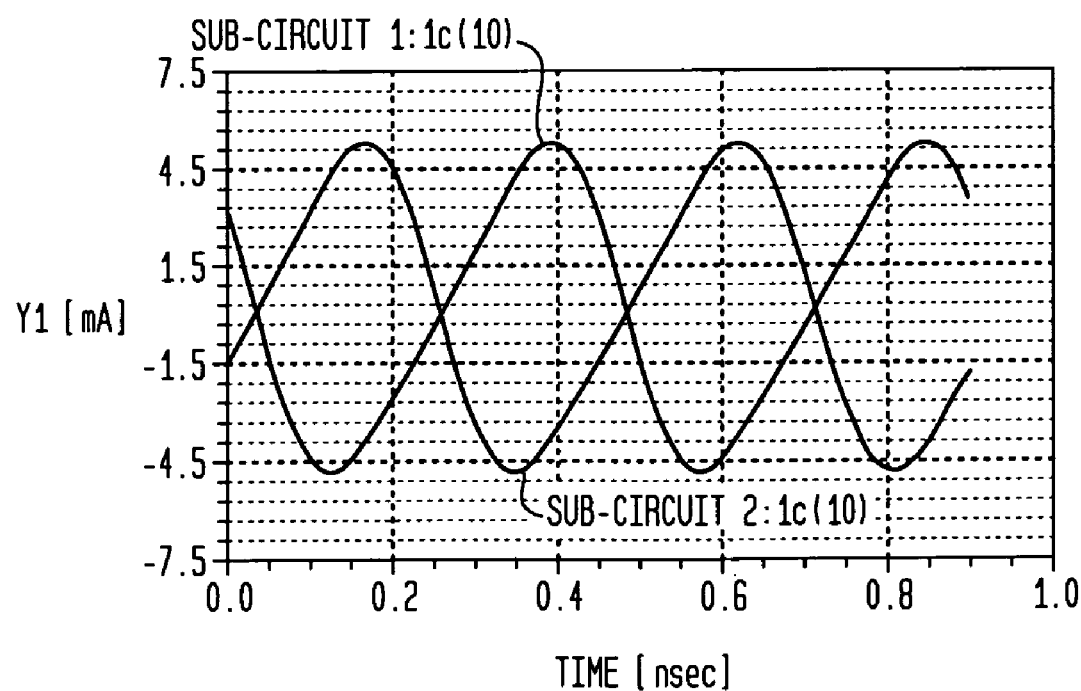
FIG. 13 is a plot of the RF-collector current of the circuitry depicted in FIG. 12.
Figure 14:
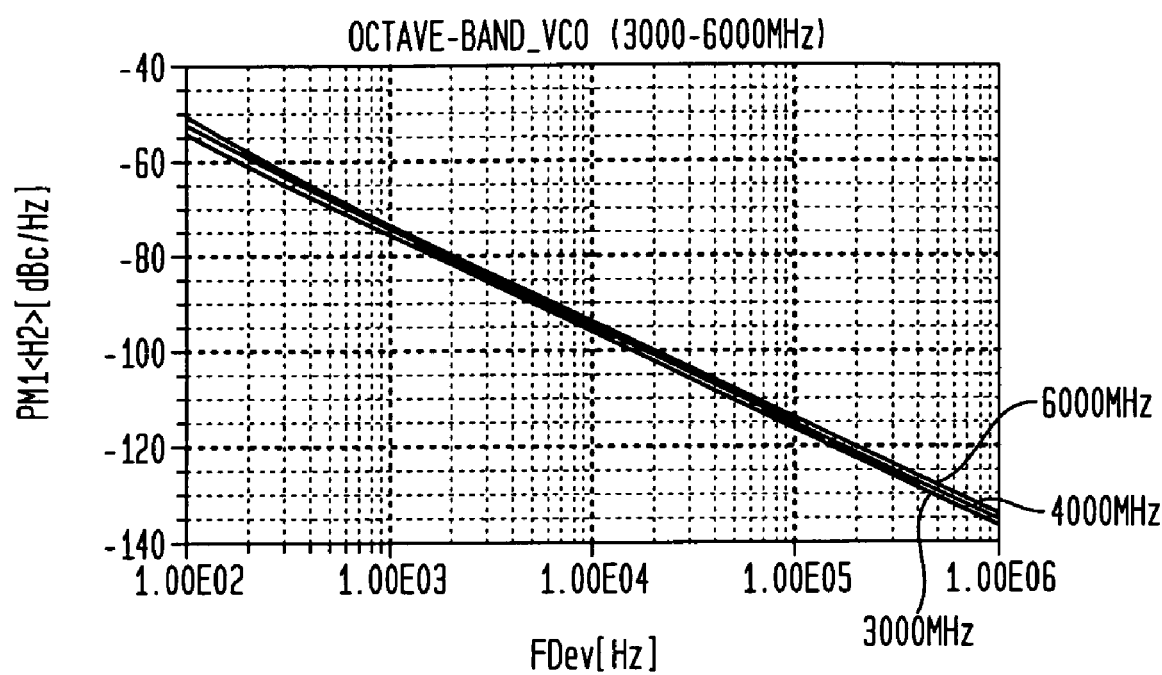
FIG. 14 illustrates a phase noise plot over an octave-band frequency range of 1.6 GHz to 3.2 GHz.

FIG. 13 is a plot 1300 of the RF-base currents of both sub-circuits of FIG. 11, which are out of phase for the fundamental (undesired frequency of the operation, 1500–3000MHz) FIG. 14 shows a phase noise plot 1400 for octave-band frequency range of 3000–6000 MHz for the circuitry shown in FIG. 11.

Figure 15:
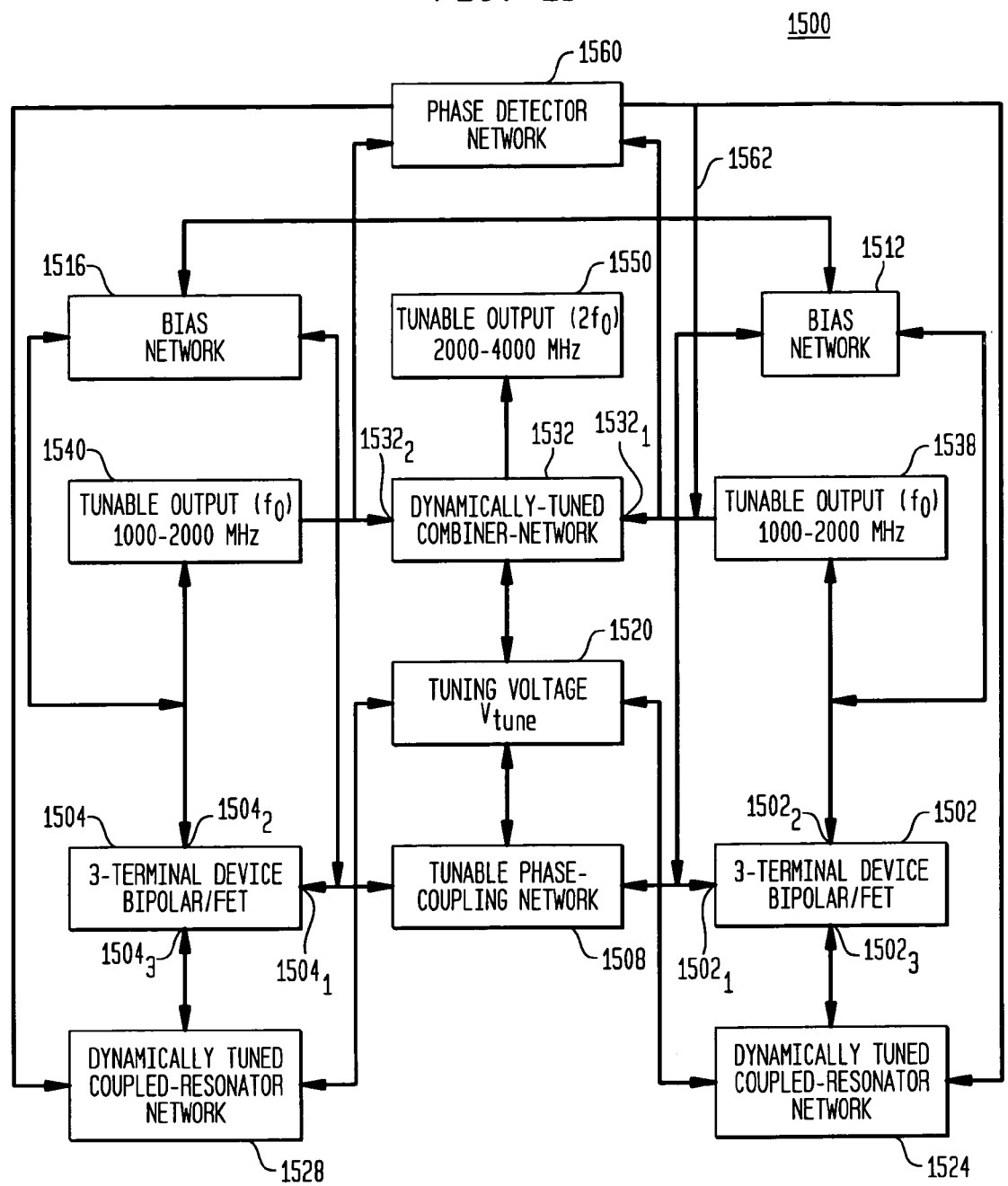
FIG. 15 is a functional block diagram illustrating the modules of an oscillator in accordance with an aspect of the present invention.

Turning now to FIG. 15, there is illustrated a VCO or oscillator 1500 in accordance with an aspect of the present invention. The VCO 1500 is shown as operating in the frequency range of 1 GHz–2 GHz/2 GHz–4 GHz, although the individual functional blocks and their accompanying circuit parameters, e.g., resistor values, capacitor values, etc., may be selected and arranged so that the circuit operates at a different fundamental frequency and produces a tunable output at both the fundamental frequency and second harmonic. In addition, the topology shown in FIG. 15 may be extended from a push-push type configuration, such as 1 GHz–2 GHz/2 GHz–4 GHZ/4 GHz–8 GHz/8 GHz–16 GHz, which allows the operating frequency of the oscillator to be extended beyond the cut-off frequency of the active device.

As FIG. 15 shows, the VCO/oscillator 1500 includes a pair of three terminal devices, 1502 and 1504, which are coupled together through the other modules shown. More particularly, each device 1502 and 1504 includes three terminals, illustrated as $1502_1$, $1502_2$ and $1502_3$ and $1504_1$, $1504_2$ and $1504_3$, respectively. The first terminal $1502_1$ of first device 1502 is coupled to a tunable phase coupling network 1508 and bias network 1512. The tunable phase coupling network 1508 is also coupled to the first terminal 1504, of the second device 1504, which is also coupled to a bias network 1516 at terminal $1504_1$. The tunable phase coupling network 1508 is also coupled to tuning voltage block 1520. The tuning voltage block 1520 is coupled to dynamically tuned coupled-resonator networks, 1524, 1528, which are respectively coupled to the third terminals $1502_3$, $1504_3$ of each of the three terminal devices.

As discussed above, the three-terminal devices preferably comprise a bipolar transistor, wherein the first, second and third terminals of the three terminal device comprise the collector, base and emitter nodes of the bipolar transistor. On the other hand, the three terminal device may comprise a field effect transistor, wherein the first, second and third terminals of the three terminal device comprise the collector, base and emitter nodes of the field effect transistor. As a general matter, the three terminal device desirably includes any three terminal device that is operable to provide a 180 degree phase shift between any two terminals.

The tuning voltage block 1520 is further coupled to a dynamically-tuned combiner network 1532, which includes two input ports, $1532_1$ and $1532_2$. Each of the input ports $1532_1$ and $1532_2$ accept input signals 1538, 1540 present at the second terminals $1502_2$ and $1504_2$ of each of the devices. The dynamically-tuned combiner network 1532 combines the input signals 1538, 1540 and produces a signal 1550 operating at the second harmonic of the input signals 1538, 1540.

The oscillator 1500 further includes a phase detecting network or phase detector 1560 coupled between resonator networks 1524, 1528 and combiner network 1532, as shown. The phase detector network 1560 may be realized by using a divider, amplifier and balanced mixers arranged in a conventional manner. The divider may comprise MC10EL32, made by ON Semiconductor, Inc., and the amplifier and balanced mixes may, respectively, comprise OPAMP TL071 from Texas Instruments and mixers available from Synergy Microwave, the assignee of the present invention. The phase detector network 1560 dynamically compensates for phase errors between each oscillator during wideband operation. The phase detector network 1560 detects random fluctuations in the free-running frequency and translates those fluctuations into phase errors. The phase errors are then fed back to the combiner network 1532 (see line 1562) and used to control the phase and frequency of the output signal 1550 during tuning operation. The phase errors are also fed back to the dynamically tuned coupled resonator networks 1524, 1528 and used to tune the oscillating frequencies of the each of the three terminal devices.

The oscillator 1500 preferably operates in the following manner. The circuit elements comprising the various modules, e.g., diodes, resistors, capacitors, resonators, etc., are selected so that each of the three terminal devices 1502, 1504 oscillate at a fundamental frequency, f0. As the voltage level of the tuning voltage module 1520 is adjusted the fundamental frequency of operation, f0, appearing as input signals 1538, 1540 is tuned over the operating range of the oscillator, e.g., preferably octave-band. These signals 1538, 1540 are then combined in the combiner network 1532 to produce a signal operating at twice the fundamental frequency, 2f0, and that is dynamically tuned as the voltage level of the tuning voltage module 1520 is adjusted. A select portion of a signal 1554 from the combiner network 1532 is also fed back to the tuning block 1520. A portion of the signal 1554 is then fed to tunable phase coupling network 1508 and used to dynamically tune the phase of the output signals 1538, 1540, so that each of these signals remain in phase during a tuning operation. A portion of the signal 1554 is also fed to each of the dynamically-tuned coupled resonator networks 1524, 1528, so that the frequency, f0, present at block 1538 is at the same frequency as the signal present at block 1540. Accordingly, as the tuning voltage, $V_{tune}$, is adjusted the frequency of the signals, f0, present at each of the terminals $1502_2$ and $1504_2$ are tuned over the operating frequency band through the coupled resonator networks 1524, 1528, while the phase coupling network 1508 keeps the two devices 1502, 1504 operating in an anti-phase mode at the fundamental frequency, f0 (e.g., push-pull behavior), while the second harmonic, 2f0, interferes constructively (e.g., push-push behavior) over the octave band. In addition, the phase detector network 1560 operates as described above to dynamically compensate for phase errors during wideband operation.

Figure 16:
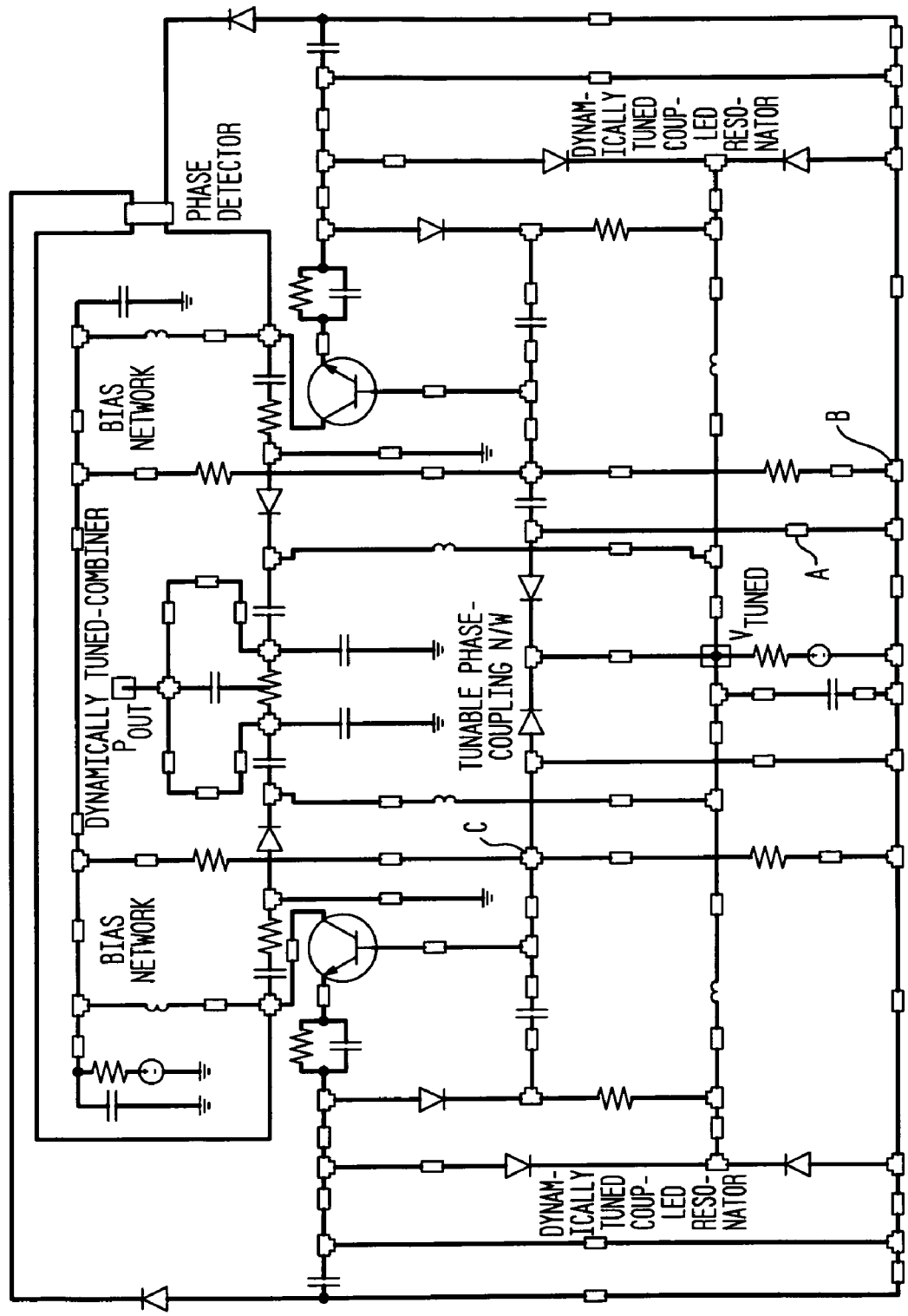
FIG. 16 is a schematic circuit diagram of a VCO in accordance with an aspect of the present invention.

FIG. 16 depicts a schematic circuit diagram 1600 of a VCO designed in accordance with the principles of FIG. 15 in accordance with an additional aspect of the present invention. In particular, FIG. 16 illustrates a dynamically tuned coupled-resonator network, dynamically tuned phase-coupling network, dynamically tuned phase detector and dynamically tuned combiner network for octave-band 2-Push/Push-Push operation. As one of ordinary skill in the art may recognize, the rectangular blocks (e.g., A) in FIG. 16 (and the other circuit diagrams that comprise this disclosure) are transmission lines and coupling blocks (e.g., B or C) are three port (T-connector) or four port connecters or couplers that connected different circuit branches. Although FIG. 16 shows a 2-Push configuration the circuitry may be extended to a N-Push configuration and provide a tunable signal at N times the fundamental frequency of the sub-circuit's operation. The sub-circuits comprise the respective bias networks, resonator networks and three-terminal devices, which in this embodiment are depicted as bipolar transistors although FETs may be used also. The values of the individual circuit elements may be chosen so that the resulting output signal from the circuitry operates in the L, S and C band and is tunable over a desired frequency band, preferably octave-band. This configuration is intended to overcome the limitations of the fixed frequency operation of the push-push oscillator/N-push oscillator by including a tuning and phase controlling network over the desired frequency band (preferably octave-band).

Figure 17:
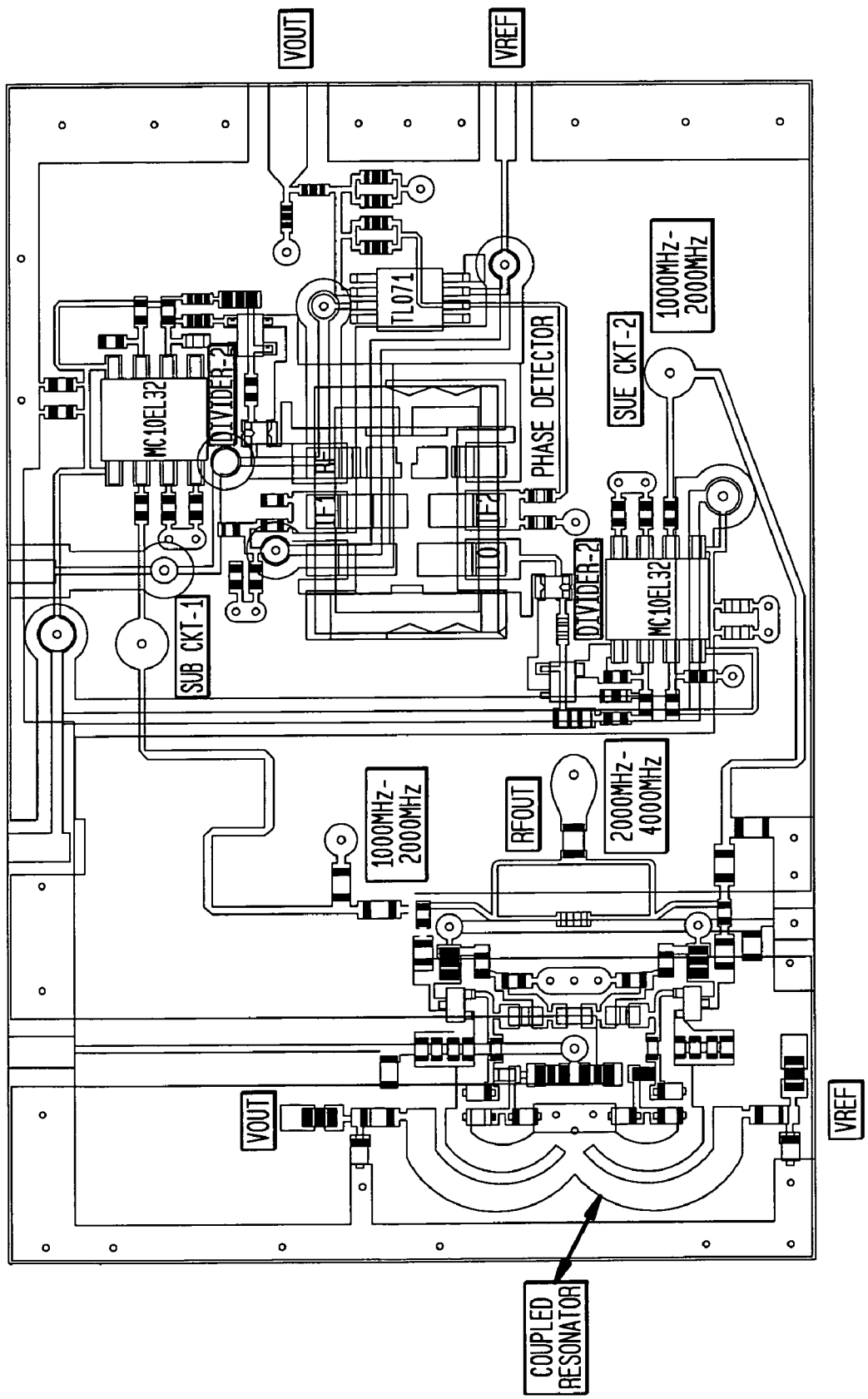
FIG. 17 is a schematic of an integrated circuit comprising a VCO in accordance with an aspect of the present invention.

FIG. 17 illustrates a schematic layout of an integrated circuit (IC) 1700 designed in accordance with the schematic circuit diagram of FIG. 16 with the values of the various circuit elements chosen such that the fundamental frequency is tunable over the frequency range of 1000 MHz to 2000 MHz (1 GHz to 2 GHz). In addition, the circuitry 1700 also provides an output that is tunable over the frequency range of 2000 MHz to 4000 MHz (2 GHz to 4 GHz). As FIG. 17 shows, the functional diagram of FIG. 15 and the circuitry of FIG. 16 are amenable to implementation as an integrated circuit. More particularly, the integrated circuitry of FIG. 17 includes a printed microstripline resonator and various discrete elements that may be preferably implemented in Roger material.

Figure 18:
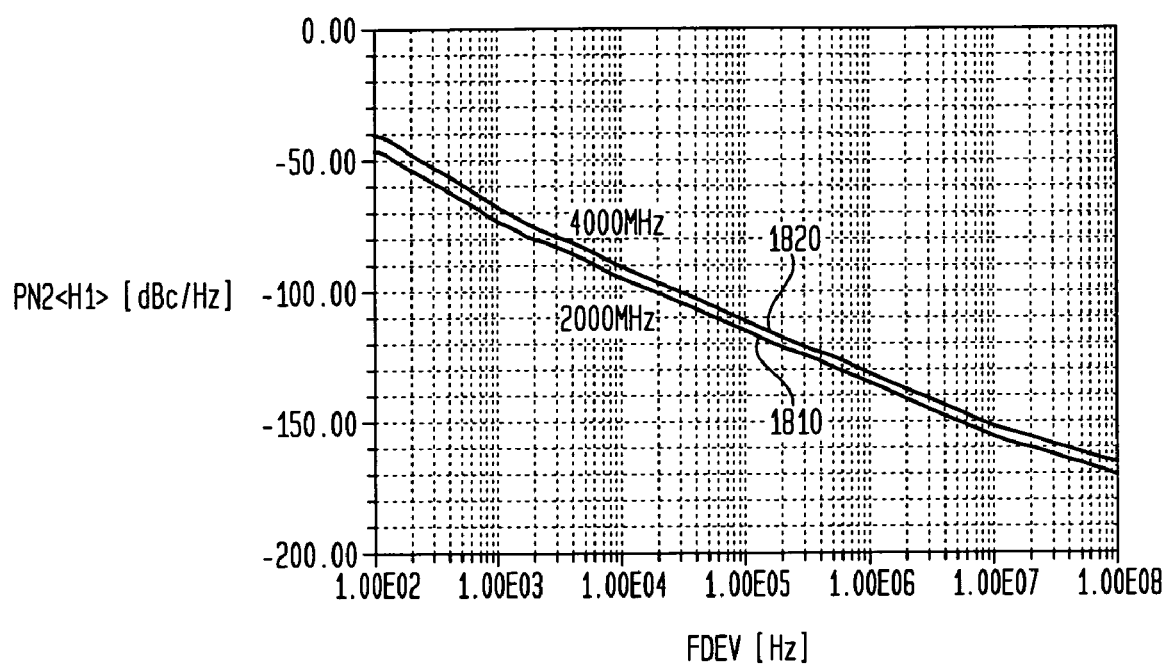
FIG. 18 illustrates a phase noise plot for a VCO in accordance with an aspect of the present invention.

Turning now to FIG. 18, there is shown a phase noise plot of a VCO designed and operating in accordance with FIG. 15. As FIG. 18 shows, the phase noise is approximately −95 dBc/Hz at 10 KHz (line 1810) for the fundamental frequency of operation and better than −90 dBc/Hz at 10 KHz (line 1820) for the second harmonic signal.

In view of the foregoing, in one aspect the present invention provides a circuit topology, which supports wideband tunability in a compact size that is amenable to integration in an integrated circuit or chip form. The random fluctuations in the free-running frequency due to the fabrication tolerances of the components are translated into phase errors. For ultra low phase noise operation in a coupled oscillator system, it is desirable to minimize the phase errors by making the free-running frequencies of the oscillators agree as tightly possible. The difference between the oscillator free-running frequencies and the array ensemble frequency of the coupled oscillator systems is compensated for by a feedback network (e.g., a phase detector circuit), which provides a correction voltage corresponding to the phase-shift of a tuning diode network integrated with the common resonator circuit.

A voltage controlled oscillator implemented in accordance with the present invention may be employed in any number of devices that are used to communicate on data, telephone, cellular or, in general, communications network. Such devices may include but are not limited to, for example, cellular phones, personal digital assistants, modem cards, lap tops, satellite telephones or RF transceivers. As a general matter, the oscillator circuitry shown in the various drawings and described above may be employed in a PLL to either generate a clock signal that may be used to transmit or recover information transmitted or received over a network. In addition to wireless networks, the circuitry of the present invention may be employed in wired networks, satellite networks, etc.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. Voltage controlled oscillator, comprising:
a first device having first, second and third terminals;
a second device having first, second and third terminals;
circuitry comprising tunable coupled resonator networks coupled to the third terminals of each of the devices through a tuning voltage network; and
a phase detector coupled to the circuitry and operable to dynamically detect phase errors that occur between the first device and the second device and feedback a phase error signal associated with the detected phase error to the first or second device, and
wherein the voltage of the tuning network can be adjusted to tune a frequency of an output signal of the voltage controlled oscillator over at least an octave frequency band.

2. The voltage controlled oscillator of claim 1, further comprising a bias network coupled between the first and second terminals of the first and second devices.

3. The voltage controlled oscillator of claim 1, further comprising a dynamically tuned combiner network coupled between the second terminals of each of the devices to combine signals present at the second terminals into an output signal tunable over an operating frequency range that is twice the fundamental frequency of operation of each of the devices.

4. The voltage controlled oscillator of claim 1, wherein the first and second devices each comprise bipolar transistors.

5. The voltage controlled oscillator of claim 1, wherein the first and second devices each comprise field effect transistors.

6. The voltage controlled oscillator of claim 1, wherein the tunable resonator networks comprise a pair of micro-stripline coupled resonators arranged in a horse-shoe configuration.

7. The voltage controlled oscillator of claim 1, wherein the first device, second device and circuitry are implemented in an integrated circuit.

8. The voltage controlled oscillator of claim 7, wherein the integrated circuit further comprises a printed microstripline coupled resonator that is operable as the tunable resonator.

9. An oscillator, comprising:
first and second oscillators arranged in a push-push configuration;
first and second tuning diode networks coupled to the first and second oscillators for dynamically adjusting a fundamental frequency of output signals of the first and second oscillators; and
a phase detector coupled to the first and second tuning diode networks for dynamically detecting phase errors between each oscillator and feeding back a phase error signal associated with the detected phase errors to the first or second oscillator during wideband operation.

10. The oscillator of claim 9, wherein the voltage of the tuning network can be adjusted to tune the fundamental frequency of each output signal over an octave frequency band.

11. The oscillator of claim 9, wherein the first and second three-terminal devices each comprise bipolar transistors.

12. The oscillator of claim 9, wherein the first and second devices each comprise field effect transistors.

13. The oscillator of claim 9, wherein the tunable resonator network circuitry comprise a pair of micro-stripline coupled resonators arranged in a horse-shoe configuration.

14. The oscillator of claim 9, further comprising a dynamically tuned combiner network for combining each of the output signals to produce a final output signal having a frequency at twice the fundamental frequencies of each output signal.

15. A network communication device, the device comprising:
 a phase lock loop for generating a clock signal used to transmit or recover information communicated from or to the device,
 wherein the phase lock loop includes a voltage controlled oscillator for generating the clock signal, the voltage controlled oscillator comprising,
 first and second oscillators arranged in a push-push configuration;
 first and second tuning diode networks coupled to the first and second oscillators for dynamically adjusting a fundamental frequency of output signals of the first and second oscillators; and
 a phase detector integrated with the first and second tuning diode networks for dynamically detecting phase errors between each oscillator and feeding back a phase error signal associated with the detected errors to the first or second oscillator during wideband operation.

16. The communication device of claim 15, wherein the communication device comprises a wireless device.

17. The communication device of claim 16, wherein the wireless device is a cellular telephone.

18. The communication device of claim 16, wherein the wireless device is a personal digital assistant.

19. A telephone, comprising:
 a phase lock loop for generating a clock signal used to transmit or recover information signals communicated by the telephone, the phase lock loop comprising a voltage controlled oscillator for generating the clock signal, the voltage controlled oscillator comprising:
 a first device having first, second and third terminals;
 a second device having first, second and third terminals;
 circuitry comprising tunable coupled resonator networks coupled to the third terminals of each of the devices through a tuning voltage network; and
 a phase detector coupled to the circuitry and operable to dynamically detect phase errors that occur between the first device and the second device and feedback a phase error signal associated with the detected phase error to the first or second device, and
 wherein a voltage of the tuning network can be adjusted to tune a frequency of an output signal frequency of the voltage controlled oscillator.

20. The telephone of claim 19, wherein the telephone comprises a cellular telephone.

21. The telephone of claim 19, wherein the information includes voice or data.

22. The telephone of claim 21, wherein the data includes image data.

23. A method for tuning an oscillator output signal, comprising:
 arranging first and second oscillators in a push-push configuration;
 adjusting a fundamental frequency of output signals of the first and second oscillators by tuning first and second tuning diode networks coupled to the first and second oscillators;
 detecting phase errors between each oscillator through a phase detector coupled to the first and second oscillators; and
 adjusting the phase associated with each of the output signals of the first and second oscillators based on the detected phase errors and in response to the tuning of the diode networks.

24. The method of claim 23, further comprising adjusting a voltage of the tuning network to change the fundamental frequency of each output signal over an octave frequency band.

25. The method of claim 23, further comprising combining each of the output signals to produce a final output signal having a frequency at twice the fundamental frequency of each output signal.

* * * * *

UNITED STATES PATENT AND TRADEMARK OFFICE
CERTIFICATE OF CORRECTION

PATENT NO. : 7,088,189 B2
APPLICATION NO. : 11/007879
DATED : August 8, 2006
INVENTOR(S) : Ulrich L. Rohde, Ajay Kumar Poddar and Reimund Rebel It is certified that error appears in the above-identified patent and that said Letters Patent is hereby corrected as shown below:

Column 2, line 41, "VCOS" should road -- VCOs --.
Column 8, line 35, "band" should read -- band. --.
Column 9, line 51, "7101, 7102 and 7103." should read -- $710_1$, $710_2$ and $710_3$. --.
Column 10, line 16, "(820, and 8202)." should read --($820_1$ and $820_2$). --
Column 11, line 7, ") FIG. 14" should read -- ). FIG. 14 --.
Column 11, line 33, "1504," should read -- $1504_1$, --.

Signed and Sealed this

Tenth Day of April, 2007

JON W. DUDAS
*Director of the United States Patent and Trademark Office*